(12) United States Patent
Lee et al.

(10) Patent No.: US 8,552,488 B2
(45) Date of Patent: Oct. 8, 2013

(54) NONVOLATILE MEMORY DEVICES HAVING GATE STRUCTURES DOPED BY NITROGEN

(75) Inventors: Chang-Hyun Lee, Suwon-si (KR); Dong-Gun Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/181,134

(22) Filed: Jul. 12, 2011

(65) Prior Publication Data

US 2011/0266608 A1  Nov. 3, 2011

Related U.S. Application Data

(60) Continuation of application No. 12/488,061, filed on Jun. 19, 2009, now Pat. No. 8,008,153, which is a division of application No. 11/471,798, filed on Jun. 21, 2006, now Pat. No. 7,566,929, which is a continuation-in-part of application No. 11/371,379, filed on Mar. 9, 2006, now Pat. No. 7,445,994, which is a division of application No. 10/455,679, filed on Jun. 5, 2003, now Pat. No. 7,041,554.

(30) Foreign Application Priority Data

Jul. 5, 2002 (KR) .................................. 2002-38826

(51) Int. Cl.
*H01L 29/788* (2006.01)
(52) U.S. Cl.
USPC ....................................... 257/315; 257/E29.3
(58) Field of Classification Search
USPC ............................................. 257/315, E29.3
See application file for complete search history.

(56) References Cited

U.S. PATENT DOCUMENTS

| 4,774,197 | A | 9/1988 | Haddad et al. |
| 5,464,792 | A | 11/1995 | Tseng et al. |
| 5,571,734 | A | 11/1996 | Tseng et al. |
| 5,770,502 | A | 6/1998 | Lee |
| 5,837,585 | A | 11/1998 | Wu et al. |
| 5,869,858 | A | 2/1999 | Ozawa et al. |
| 5,966,615 | A | 10/1999 | Fazan et al. ................... 438/424 |
| 6,001,713 | A | 12/1999 | Ramsbey et al. ............. 438/520 |
| 6,069,041 | A | 5/2000 | Tanigami et al. |
| 6,261,920 | B1 * | 7/2001 | Oyamatsu ..................... 438/424 |
| 6,372,578 | B1 | 4/2002 | Muramatsu |
| 6,413,819 | B1 | 7/2002 | Zafar et al. |
| 6,489,649 | B2 | 12/2002 | Kobayashi et al. .......... 257/314 |
| 7,041,554 | B2 | 5/2006 | Lee et al. |

(Continued)

FOREIGN PATENT DOCUMENTS

| JP | 05-267684 | 10/1993 |
| JP | 06-029314 | 2/1994 |

(Continued)

*Primary Examiner* — Howard Weiss

(74) *Attorney, Agent, or Firm* — Myers Bigel Sibley & Sajovec

(57) ABSTRACT

Nonvolatile memory devices are provided including an integrated circuit substrate and a charge storage pattern on the integrated circuit substrate. The charge storage pattern has a sidewall and a tunnel insulating layer is provided between the charge storage pattern and the integrated circuit substrate. A gate pattern is provided on the charge storage pattern. A blocking insulating layer is provided between the charge storage pattern and the gate pattern. The sidewall of the charge storage pattern includes a first nitrogen doped layer. Related methods of fabricating nonvolatile memory devices are also provided herein.

9 Claims, 28 Drawing Sheets

(56) References Cited

U.S. PATENT DOCUMENTS

2002/0123234 A1 9/2002 Trapp
2003/0052376 A1 3/2003 Lee et al.
2003/0173615 A1 9/2003 San et al.

FOREIGN PATENT DOCUMENTS

| JP | 06-077493 | 3/1994 |
| JP | 09-129757 | 5/1997 |
| KR | 010061403 | 7/2001 |

* cited by examiner

NONVOLATILE MEMORY DEVICES HAVING GATE STRUCTURES DOPED BY NITROGEN

RELATED APPLICATIONS

This application claims priority from and is a continuation of U.S. patent application Ser. No. 12/488,061, filed Jun. 19, 2009 (now U.S. Pat. No. 8,008,153) which claims priority from and is a divisional of U.S. patent application Ser. No. 11/471,798, filed Jun. 21, 2006 (now U.S. Pat. No. 7,566,929), which claims priority from and is a continuation-in-part of U.S. patent application Ser. No. 11/371,379, filed Mar. 9, 2006 (now U.S. Pat. No. 7,445,994), which claims priority from and is a divisional of U.S. patent application Ser. No. 10/455,679, filed Jun. 5, 2003 (now U.S. Pat. No. 7,041,554), which claims priority from and is related to Korean Patent Application No. 2002-38826, filed Jul. 5, 2002, the disclosures of which are hereby incorporated herein by reference as if set forth in their entirety.

FIELD

The present inventive concept relates to integrated circuit devices and methods of fabricating the same, and, more particularly, to nonvolatile memory devices and methods of fabricating the same.

BACKGROUND

Integrated circuit devices using self-aligned shallow trench isolation technology may provide a reduced number of fabrication steps during manufacture of the integrated circuit device, enhanced reliability of a gate oxide layer and/or narrower threshold voltage distribution in a cell array. Accordingly, to improve performance of conventional nonvolatile memory devices, self-aligned shallow trench isolation technology has been applied to highly integrated nonvolatile memory devices typically requiring low fabrication costs and high reliability.

FIGS. 1 through 3 illustrate aspects of conventional nonvolatile memory devices. FIG. 1 is a top plan view illustrating conventional nonvolatile memory devices, FIGS. 2 and 3 are cross-sectional views illustrating conventional nonvolatile memory devices, taken along lines A-A' and B-B' of FIG. 1, respectively.

Referring now to FIGS. 1 through 3, a device isolation pattern is provided on an integrated circuit substrate 2 to define a plurality of active regions. A control gate electrode 16 crosses over the device isolation pattern. A floating gate pattern 9 is disposed between the control gate electrode 16 and the active regions.

The device isolation pattern includes a trench oxide layer 6 and an insulating pattern 14. The trench oxide layer 6 is provided on sidewalls of a trench region provided in the integrated circuit substrate. The insulating pattern 14 is provided in the trench region. The floating gate pattern 9 includes a lower gate pattern 4a and an upper gate pattern 8. The lower gate pattern 4a is provided between the device isolation patterns, and the upper gate pattern 8 is provided on the lower gate pattern 4a. A portion of the upper gate pattern 8 may extend on a surface of the device isolation pattern. The blocking insulating pattern 13 is disposed between the control gate electrode 16 and the floating gate pattern 9. The blocking insulating pattern 13 typically includes first 10, second 11 and third 12 layers of silicon oxide, silicon nitride and silicon oxide, respectively. The control gate electrode 16 typically includes first and second layers, for example, a polysilicon layer 14 on the blocking insulating pattern 13 and a metal silicide layer 15 on the polysilicon layer 14.

As further illustrated in FIG. 3, the nonvolatile memory device further includes a tunnel insulating pattern 3 and source/drain regions S/D. The tunnel insulating pattern 3 is provided between the floating gate pattern 9 and the integrated circuit substrate 2. The source/drain regions S/D are provided in the integrated circuit substrate 2 adjacent to the floating gate pattern 9 to be aligned to sidewalls of the floating gate pattern 9. Referring again to FIG. 2, conventional nonvolatile memory devices may include a bird's beak 7 (thickening of the trench oxide layer 6) at the edge of the tunnel insulating pattern 3 adjacent to the trench oxide layer 6.

FIG. 4 illustrates a cross-sectional view illustrating a process forming the conventional nonvolatile memory devices, taken along line A-A' of FIG. 1. Referring now to FIG. 4, methods of forming conventional nonvolatile devices include forming the tunnel insulating pattern 3, a lower conductive pattern 4 and a hard mask pattern 5 on the integrated circuit substrate 2. A trench may be formed on the integrated circuit substrate and may be aligned to sidewalls of the hard mask pattern 5. A thermal oxidization process may be applied to the integrated circuit substrate 2 including the trench to form the trench oxide layer 6 on sidewalls and a bottom of the trench. The thermal oxidization process may reduce an etch damage of the sidewalls of the trench. The sidewalls of the lower conductive pattern 4 may be oxidized, resulting in the bird's beak 7 at the edge of the tunnel insulating pattern 3, which is caused by an oxygen atom diffused through interfaces between the lower conductive pattern 4, the tunnel insulating pattern 3 and the integrated circuit substrate 2.

Referring again to FIG. 3, the nonvolatile memory device may include a gate sidewall oxide layer 19 on the sidewalls of the control gate electrode 16 and the floating gate pattern 9. The gate sidewall oxide layer 19 may be formed during a gate sidewall oxidization process to cure an etch damage of the sidewalls of the control gate electrode and the floating gate pattern. The gate sidewall oxide layer 19 may reduce the amount of etch damage of the sidewalls of the control gate electrode 16 and the floating gate pattern 9. According to conventional methods of fabrication, during formation of the gate sidewall oxide layer 19, oxygen atoms may be diffused through an interface of the blocking insulating pattern 13 to oxidize the control gate electrode 16 and the floating gate pattern 9. Accordingly, the silicon oxide layer at the edge 18 of the blocking insulating pattern 13 may become thicker (form a bird's beak) relative to the other portions of the blocking insulating pattern 13. Furthermore, the oxygen atom may be diffused through an interface of the tunnel insulating pattern 3 adjacent to the source/drain regions S/D. Thus, the edge 17 of the tunnel insulating pattern adjacent to the source/drain region S/D may also become thicker (form a bird's beak).

The nonvolatile memory device may use a charge trap pattern as a substitute of the floating gate pattern. The charge trap pattern may be aligned to the control gate electrode 6. A gate sidewall oxidation process may be performed to reduce an etch damage of sidewalls of the charge trap pattern, the blocking insulating pattern and the control gate electrode. The gate sidewall oxidation process may form a gate sidewall oxide layer on sidewalls of the tunnel insulating pattern, the charge trap pattern, the blocking insulating pattern and the control gate electrode. Accordingly, an oxide layer at the edges of the tunnel insulating pattern, the charge trap pattern and the blocking insulating pattern may become thicker (form bird's beaks) relative to the other portions of the tunnel insulating pattern, the charge trap pattern and the blocking insulating pattern.

The presence of the bird's beak on the tunnel insulating pattern, the charge trap pattern and the blocking insulating pattern may cause the reliability of the nonvolatile memory device to deteriorate and may cause an increase in the distribution of the threshold voltage in the cell array. In particular, the presence of the bird's beak on the blocking insulating pattern may lower a coupling ratio of the nonvolatile memory device, an erase speed of the nonvolatile memory device and a write speed of the nonvolatile memory device.

SUMMARY

Some embodiments of the present inventive concept provide nonvolatile memory device. The nonvolatile memory devices include an integrated circuit substrate and a charge storage pattern on the integrated circuit substrate. The charge storage pattern has a sidewall and a tunnel insulating layer is provided between the charge storage pattern and the integrated circuit substrate. A gate pattern is provided on the charge storage pattern. A blocking insulating layer is provided between the charge storage pattern and the gate pattern. The sidewall of the charge storage pattern includes a first nitrogen doped layer.

In further embodiments of the present inventive concept, the first nitrogen doped layer may extend on a sidewall of the gate pattern that is aligned to the sidewall of the charge storage pattern.

In still further embodiments of the present inventive concept, the tunnel insulating layer may extend on the integrated circuit substrate adjacent the charge storage pattern and the first nitrogen doped layer may extend on an upper surface of the tunnel insulating layer extended on the integrated circuit substrate adjacent the charge storage pattern.

In some embodiments of the present inventive concept, the blocking insulating layer may include at least one insulating layer. The insulating layer may include silicon oxide, silicon nitride, $Al_2O_3$, hafnium aluminate, hafnium silicate, $HfO_2$, HfAlO, HfAlON, HfSiO and/or HfSiON. The nonvolatile memory device may further include a second nitrogen doped layer on an upper surface of one or more of the at least one insulating layer.

In further embodiments of the present inventive concept, the charge storage pattern may include a dot layer. The dot layer may include a conducting material of a dot shape or an insulating material of a dot shape, a charge trap layer, a combination of the dot layer and the charge trap layer or a floating gate pattern. The nonvolatile memory device may further include a second nitrogen doped layer on an upper surface of at least one of the layers or the floating gate pattern.

In still further embodiments of the present inventive concept, a second nitrogen doped layer may be provide on an upper surface of the tunnel insulating layer, the charge storage pattern, and/or the blocking insulating layer.

While the present inventive concept is described above primarily with reference to nonvolatile memory devices, methods of fabricating nonvolatile memory devices are also provided.

BRIEF DESCRIPTION OF THE DRAWINGS

FIGS. 7A through 18A are cross sectional views, taken along the line A-A' of FIG. 5, illustrating processing steps in the fabrication of integrated circuit devices according to some embodiments of the present inventive concept.

FIGS. 7B through 18B are cross sectional views, taken along the line B-B' of FIG. 5, illustrating processing steps in the fabrication of integrated circuit devices according to some embodiments of the present inventive concept.

FIGS. 19A through 29A are cross sectional views, taken along the line A-A' of FIG. 6 illustrating processing steps in the fabrication of integrated circuit devices according to further embodiments of the present inventive concept.

FIGS. 19B through 29B are cross sectional views, taken along the line B-B' of FIG. 6 illustrating processing steps in the fabrication of integrated circuit devices according to further embodiments of the present inventive concept.

DETAILED DESCRIPTION

Figure 1:
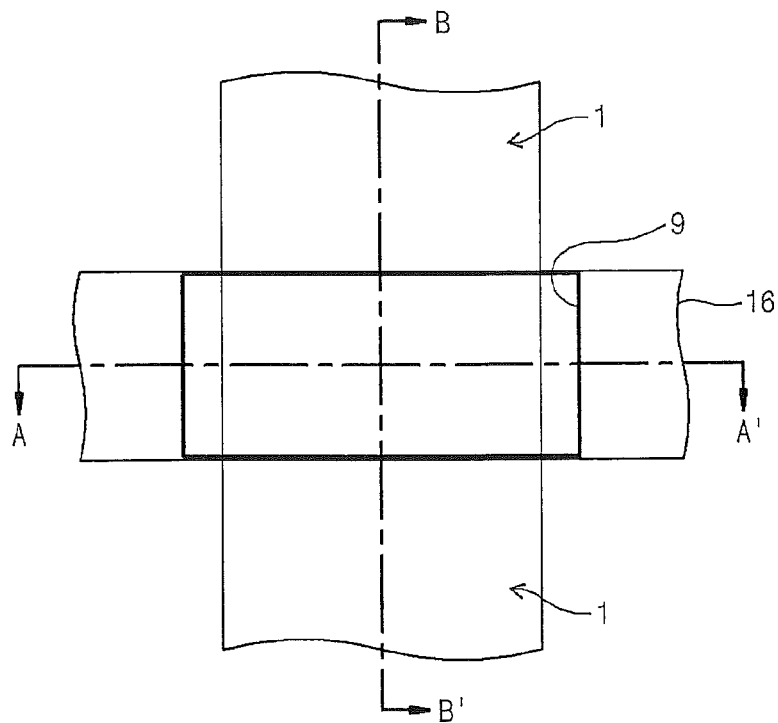
FIG. 1 is a top plan view illustrating conventional nonvolatile memory devices.
Figure 2:
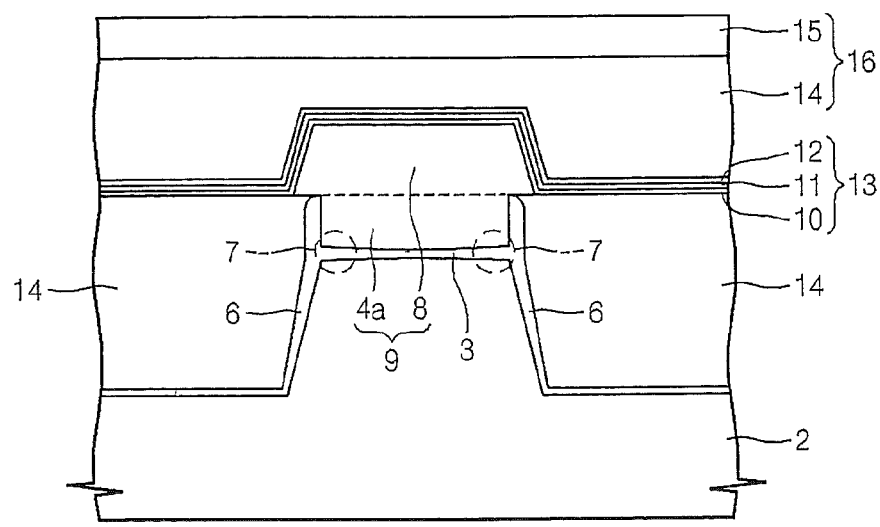
FIG. 2 is a cross-sectional view taken along the line A-A' of FIG. 1 of conventional nonvolatile memory devices.
Figure 3:
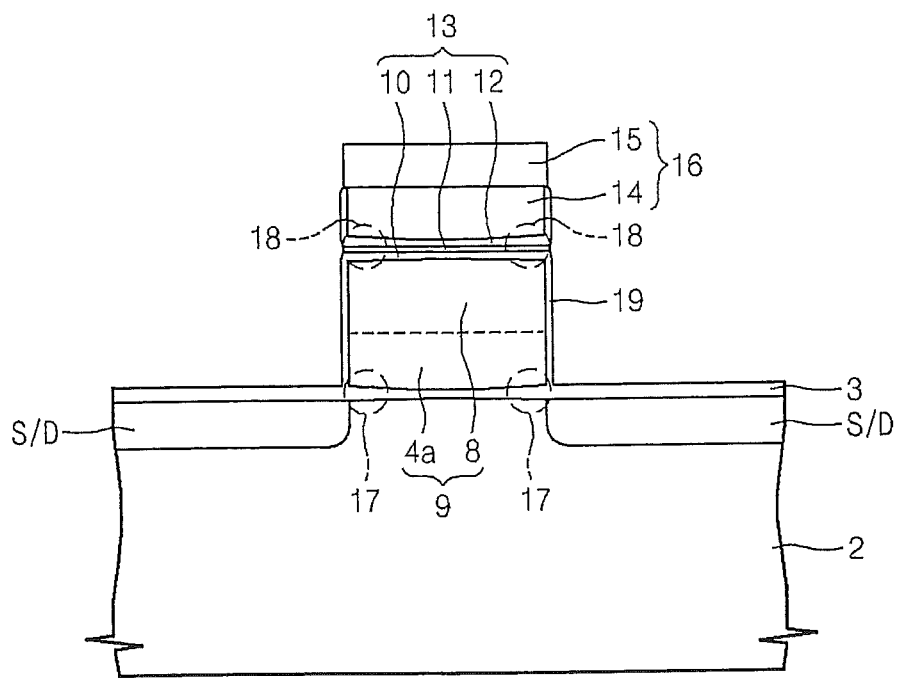
FIG. 3 is a cross-sectional view taken along the line B-B' of FIG. 1 of conventional nonvolatile memory devices.
Figure 4:
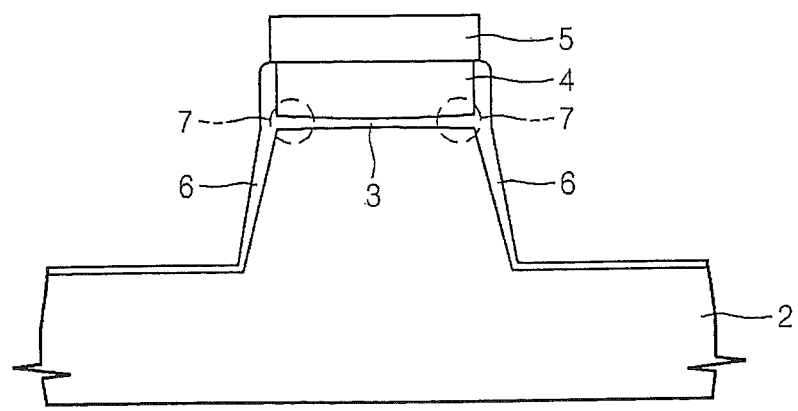
FIG. 4 is a cross-sectional view taken along the line A-A' of FIG. 1 of conventional nonvolatile memory devices, illustrating a processing step in the forming of the integrated circuit devices.

The present inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will be understood that when any nitrogen doped layer is referred to as being "on" another element or layer, it can be directly doped on another element or layer without intervening elements or layers. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the scope of the present inventive concept.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross-section illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
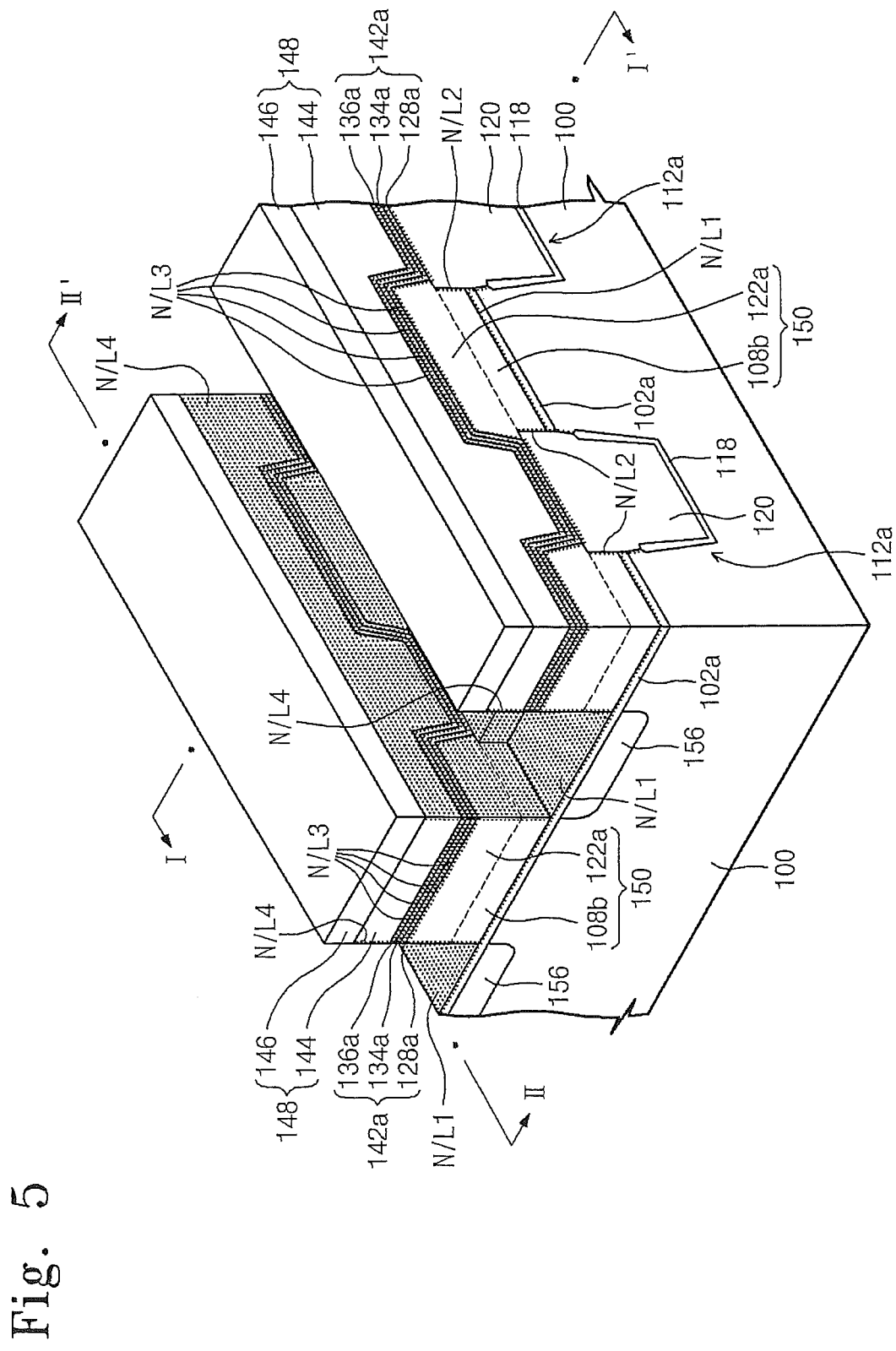
FIG. 5 is a perspective view of nonvolatile memory devices according to some embodiments of the present inventive concept.

Referring now to FIG. 5, nonvolatile memory devices according to some embodiments of the present inventive concept will be discussed. As illustrated in FIG. 5, nonvolatile memory devices according to some embodiments of the present inventive concept include a device isolation pattern on an integrated circuit substrate 100. The device isolation pattern may include, for example, a trench oxide layer 118 and an insulating pattern 120. The trench oxide layer 118 may be provided on sidewalls and a bottom of a trench region 112a and the insulating pattern 120 is provided in the trench region 112a. As illustrated, the trench oxide layer 118 may not be formed on an upper portion of the sidewalls of the trench region 112a. Thus, the upper portion of the sidewalls of the trench region 112a that is does not include the trench oxide layer 118 may contact the insulating pattern 120.

As further illustrated in FIG. 5, nonvolatile memory device according to some embodiments of the present inventive concept may further include a gate electrode 148 and a charge storage pattern 150. The gate electrode may be, for example, a control gate electrode 148 of the flash memory device, and the charge storage pattern may be, for example, a floating gate pattern 150 of the flash memory device. The control gate electrode 148 crosses over the device isolation pattern. It will be understood that the control gate electrode 148 may include one or more layers without departing from the scope of the present inventive concept. For example, the control gate electrode 148 may include a single conductive layer or may include a polycide layer having a polysilicon layer 144 and a metal silicide layer 146 on the polysilicon layer as illustrated in FIG. 5. The floating gate pattern 150 is provided between the control gate electrode 148 and the integrated circuit substrate 100. The floating gate pattern 150 is further provided on the integrated circuit substrate between the device isolation pattern. The floating gate pattern 150 may include a lower gate pattern 108a and an upper gate pattern 112a. The upper gate pattern 112a is provided on the lower gate pattern 108a. The edge of the upper gate pattern 112a may contact a surface of the insulating pattern 120 as illustrated in FIG. 5. The floating gate pattern 150 has first sidewalls that are aligned to sidewalls of the control gate electrode 148.

As further illustrated in FIG. 5, nonvolatile memory devices according to some embodiments of the present inventive concept may further include a blocking insulating pattern 142a and a tunnel insulating pattern 102a. The blocking insulating pattern 142a is provided between the control gate electrode 148 and the floating gate pattern 150. The blocking insulating pattern 142a may include an insulating layer, capable of reducing the likelihood of leakage of electrons from the floating gate pattern to the control gate electrode. The blocking insulating pattern 142a may include at least one insulating layer having a higher dielectric constant than a tunnel insulation pattern. The blocking insulating pattern 142a may include at least one insulating layer, which may include silicon oxide, silicon nitride, $Al_2O_3$, hafnium aluminate, hafnium silicate, $HfO_2$, HfAlO, HfAlON, HfSiO, HfSiON, or any combination thereof. The blocking insulating pattern 142a may include a first layer 128a, a second layer 134a and a third layer 136a, for example, a first silicon oxide layer, a silicon nitride layer on the first silicon layer and a second silicon oxide layer on the silicon nitride layer. The blocking insulating pattern 142a may be provided on the floating gate pattern 150 and the control gate electrode 148 may be provided on the blocking insulating pattern 142a. Accordingly, together the floating gate pattern 150, the blocking insulating pattern 142a and the control gate electrode may provide a stack gate structure. The tunnel insulating pattern 102a is provided between the floating gate pattern 150 and the integrated circuit substrate 100. The tunnel insulating pattern 102a may include, for example, silicon oxide, $Al_2O_3$, or $HfO_2$. The tunnel insulating pattern 102a may extend on the integrated circuit substrate adjacent the stack gate structure, or remain only under the stack gate structure.

The insulating pattern 120 may have sidewalls, a top portion of which is wider than a bottom portion and protrudes from a top surface of the integrated circuit substrate. The lower gate pattern 108a is provided between the protruded sidewalls of adjacent insulating patterns 120. Accordingly, second sidewalls of the lower gate pattern 108a may contact the protruded sidewalls of the insulating pattern 120, i.e., the device isolation pattern. The nonvolatile memory device may further include source and drain regions 156. The source and drain regions 156 are provided in the integrated circuit substrate adjacent to the floating gate pattern 150 and may be aligned to the first sidewalls of the floating gate pattern 150.

As further illustrated in FIG. 5, the nonvolatile memory device may further include nitrogen doped layers N/L1, N/L2, N/L3, N/L4. The nitrogen doped layers may block a diffusion route of oxygen during a fabrication process, which may improve the overall functionality of the device. The nitrogen doped layers may be provided on an upper surface of the tunnel insulating pattern 102a, the floating gate pattern 150 and/or the blocking insulating pattern 142a. In particular, first nitrogen doped layers N/L1 may be provided on an upper surface of the tunnel insulating pattern 102a. The first nitrogen doped layers N/L1 may reduce the amount of oxygen atoms diffused into an interface between the tunnel insulating pattern 102a and the floating gate pattern 150.

Second nitrogen doped layers N/L2 may be provided in the upper sidewalls of the trench region 112a, sidewalls of the tunnel insulating pattern 102a and/or sidewalls of the lower gate pattern 108a that may be aligned to be in contact with the insulating pattern 120. Accordingly, it may be possible to reduce the likelihood of the formation of a bird's beak at the edge of the tunnel insulating pattern 102a adjacent to the device isolation pattern. Thus, the nonvolatile memory device may have a uniform tunnel insulating pattern 102a, i.e., no substantial thickening of the tunnel insulating pattern 102a.

Furthermore, third nitrogen doped layers N/L3 may be provided on an upper surface of the upper gate pattern 122a of the floating gate pattern 150. The third nitrogen doped layers N/L3 may be provided on an upper surface of one or more of the at least one insulating layers constituting the blocking insulating pattern 142a, for example, the first layer 128a of the blocking insulating pattern 142a, the second layer 134a of the blocking insulating pattern 142a and/or the third layer 136a of the blocking insulating pattern 142a. Thus, for example, during a gate sidewall oxidization process for curing etch damage of the sidewalls of the stack gate structure, the third nitrogen doped layers N/L3 provided on the surface of the floating gate pattern 150, the first silicon oxide layer 128a and the second silicon oxide layer 136a may reduce the amount of oxygen atoms diffused into the floating gate pattern 150, the blocking insulating pattern 142a and/or the control gate electrode 148. Accordingly, it may be possible to reduce the likelihood that the edge of the floating gate pattern 150 and/or the control gate electrode 148 will be oxidized. Therefore, the blocking insulating pattern 142a may have a uniform thickness.

The forth nitrogen doped layers N/L4 may be provided on sidewalls of the stack gate structure. In some embodiments of the present inventive concept, the tunnel insulating pattern 102a may exist only under the floating gate pattern 150. In these embodiments, the forth nitrogen doped layers N/L4 may be provided on the sidewalls of the tunnel insulating pattern 102a adjacent to the source/drain region 156. The forth nitrogen doped layers N/L4 provided on the sidewalls of the stack gate structure may be provided before the gate sidewall oxidization process. Thus, it may be possible to reduce the likelihood that oxygen atoms will be diffused through the sidewalls of the tunnel insulating pattern 102a. The forth nitrogen doped layers N/L4 provided in the sidewalls of the stack gate structure may reduce the amount of oxygen atoms diffused into interfaces between the floating gate pattern 150, the blocking insulating pattern 142a and the control gate electrode 148.

It will be understood that the perspective view of the nonvolatile memory device illustrated in FIG. 5 is provided for exemplary purposes only and that embodiments of the present inventive concept are not limited to this configuration. Features may be added and/or deleted from the nonvolatile memory device illustrated in FIG. 5 without departing from the scope of the present inventive concept.

Figure 6:
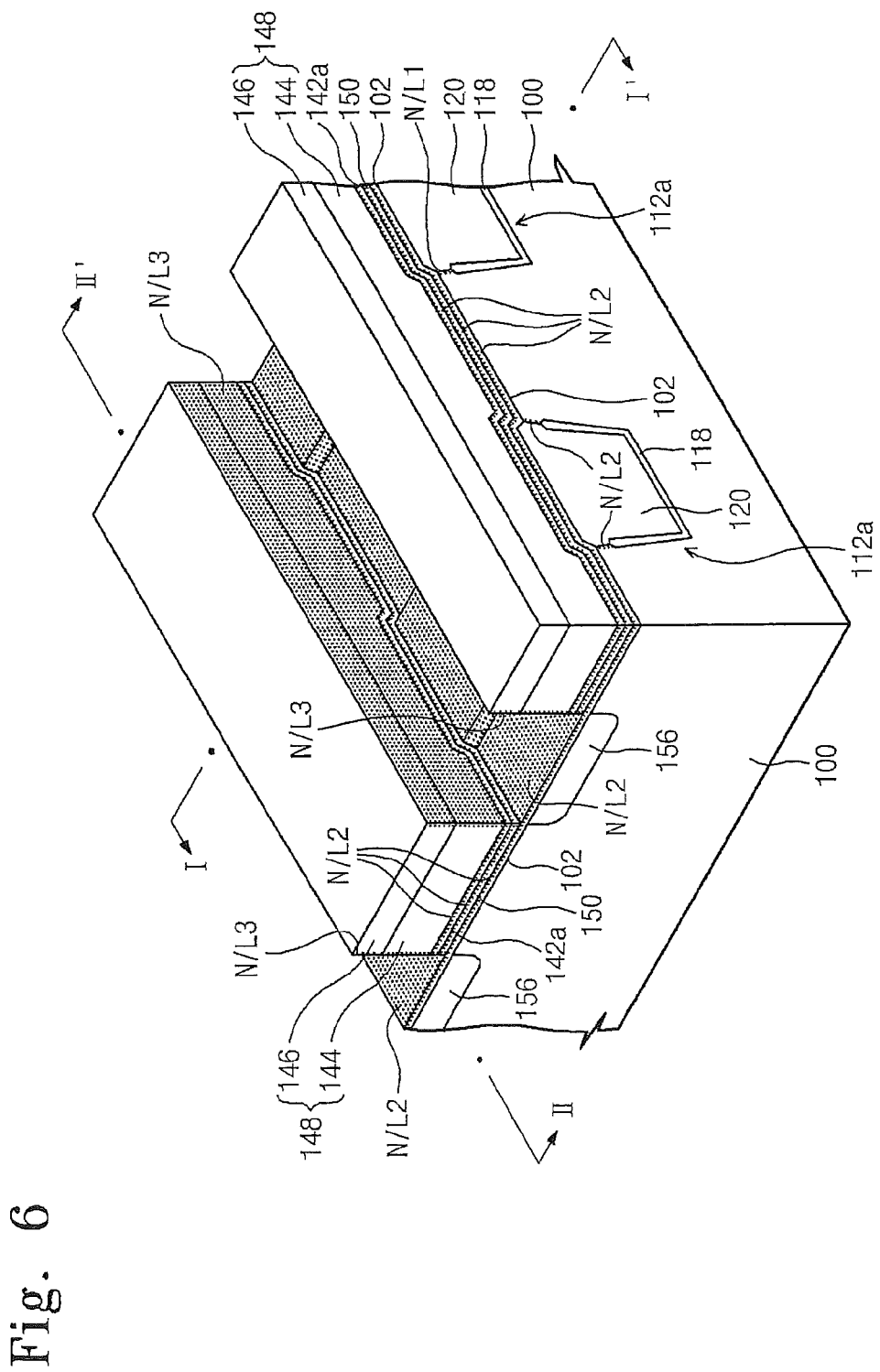
FIG. 6 is a perspective view of nonvolatile memory devices according to further embodiments of the present inventive concept.

Referring now to FIG. 6, a nonvolatile memory device according to further embodiments of the present inventive concept will be discussed. As illustrated in FIG. 6, the nonvolatile memory device includes a device isolation pattern on an integrated circuit substrate 100. The device isolation pattern may include, for example, a trench oxide layer 118 and an insulating pattern 120. The trench oxide layer 118 may be provided on sidewalls and a bottom of a trench region 112a and the insulating pattern 120 is provided in the trench region 112a. As illustrated, the trench oxide layer 118 may be not formed on an upper portion of the sidewalls of the trench region 112a. Thus, the upper portion of the sidewall of the trench region 112a that does not include the trench oxide layer 118 may contact the insulating pattern 120.

As further illustrated in FIG. 6, the nonvolatile memory device may further include a gate electrode 148 and a charge storage pattern 150. The gate electrode may be, for example, a control gate electrode 148 of the flash memory device. The control gate electrode 148 crosses over the device isolation pattern. It will be understood that the control gate electrode 148 may include one or more layers without departing from the scope of the present inventive concept. For example, the control gate electrode 148 may include a single conductive layer or may include a polycide layer having a polysilicon layer 144 and a metal silicide layer 146 on the polysilicon layer as illustrated in FIG. 6. The charge storage pattern 150 is provided between the control gate electrode 148 and the integrated circuit substrate 100. The charge storage pattern 150 may extend over the device isolation pattern, and between the control gate electrode 148 and the integrated circuit substrate 100. The charge storage pattern 150 may include a dot layer, a charge trap layer, or any combination thereof. The dot layer may include a conducting material of a dot shape or an insulating material of a dot shape. The charge trap layer may include a silicon nitride, $Al_2O_3$, a hafnium aluminate, a hafnium silicate, $HfO_2$, HfAlO, HfAlON, HfSiO, HfSiON, or any combination thereof. The charge storage pattern 150 has first sidewalls aligned to sidewalls of the control gate electrode 148.

As still further illustrated in FIG. 6, nonvolatile memory devices may further include a blocking insulating pattern 142a and a tunnel insulating layer 102. The blocking insulating pattern 142a is provided between the control gate electrode 148 and the charge storage pattern 150. The blocking insulating pattern 142a may include an insulation layer, capable of reducing the likelihood of leakage of electrons from the charge storage pattern to the control gate electrode. The blocking insulating pattern 142a may include at least one insulating layer having a higher dielectric constant than a tunnel insulating layer. The blocking insulating pattern 142a may include at least one insulating layer, which may include, for example, silicon oxide, silicon nitride, Al2O3, a hafnium aluminate, a hafnium silicate, $HfO_2$, HfAlO, HfAlON, HfSiO, HfSiON, or any combination thereof. The blocking insulating pattern 142a may be provided on the charge storage pattern 150 and the control gate electrode 148 may be provided on the blocking insulating pattern 142a. Accordingly, together the charge storage pattern 150, the blocking insulating pattern 142a and the control gate electrode 148 may provide a stack gate structure. The tunnel insulating layer 102 is provided between the charge storage pattern 150 and the integrated circuit substrate 100. The tunnel insulating layer 102 may include, for example, a silicon oxide, $Al_2O_3$, or $HfO_2$. The tunnel insulating layer 102 may be extended on the integrated circuit substrate adjacent the stack gate structure, or remain only under the stack gate structure.

The insulating pattern 120 may have sidewalls, top portions of which are wider than bottom portions and protrude from a top surface of the integrated circuit substrate. The tunnel insulating layer 102, the charge storage pattern 150 and/or the blocking insulating pattern 142a may be provided only between the protruded sidewalls of adjacent insulating patterns 120. Accordingly, second sidewalls of the charge storage pattern 150 may contact the protruded sidewalls of the insulating pattern 120, i.e., the device isolation pattern. The nonvolatile memory device further includes source and drain regions 156. The source and drain regions 156 are provided in the integrated circuit substrate adjacent to the charge storage pattern 150 and may be aligned to the first sidewalls of the charge storage pattern 150.

As further illustrated in FIG. 6, the nonvolatile memory device may further include nitrogen doped layers N/L1, N/L2, N/L3. The nitrogen doped layers may block a diffusion route of oxygen during a fabrication process, which may improve the overall functionality of the device. In particular, first nitrogen doped layers N/L1 may be provided on the upper sidewalls of the trench region 112a. Accordingly, it may be possible to reduce the likelihood of the formation of a bird's beak at the edge of the tunnel insulating layer 102 adjacent to the device isolation pattern. Thus, the nonvolatile memory device may have a uniform tunnel insulating layer 102, i.e., no substantial thickening of the tunnel insulating layer 102.

Furthermore, second nitrogen doped layers N/L2 may be provided on an upper surface of the tunnel insulating layer 102, the charge storage pattern 150 and/or the blocking insulating pattern 142a. The second nitrogen doped layers N/L2 may be provided on an upper surface of one or more of the at least one insulating layer constituting the blocking insulating pattern 142a. The second nitrogen doped layers N/L2 may be provided on an upper surface of the dot layer and/or the charge trap layer constituting the charge storage pattern 150. The second nitrogen doped layers N/L2 may reduce the amount of oxygen atoms diffused into the charge storage pattern 150, the blocking insulating pattern 142a and/or the control gate electrode 148. Accordingly, it may be possible to reduce the likelihood of the formation of a bird's beak at the edges of the tunnel insulating layer 102, the charge storage pattern 150 and the blocking insulating pattern 142a. Thus, the tunnel insulating layer 102, the charge storage pattern 150 and the blocking insulating pattern 142a may have a uniform thickness.

Third nitrogen doped layers N/L3 may be provided on the sidewalls of the stack gate structure. In some embodiments of the present inventive concept the tunnel insulating layer 102 exists only under the charge storage pattern 150. In these embodiments of the present inventive concept, the third nitrogen doped layers N/L3 may be provided on the sidewalls of the tunnel insulating layers 102 adjacent to the source/drain region 156. The third nitrogen doped layers N/L3 formed on the sidewalls of the stack gate structure may be provided before the gate sidewall oxidization process. Thus, it may be possible to reduce the likelihood that oxygen atoms will be diffused through the sidewalls of the tunnel insulating layer 102. The third nitrogen doped layers N/L3 formed on the sidewalls of the stack gate structure may reduce the amount of oxygen atoms diffused through interfaces between the tunnel insulating layers, the charge storage pattern 150, the blocking insulating pattern 142a and the control gate electrode 148.

It will be understood that the perspective view of the nonvolatile memory device illustrated in FIG. 6 is provided for exemplary purposes only and that embodiments of the present inventive concept are not limited to this configuration. Features may be added and/or deleted from the nonvolatile memory device illustrated in FIG. 6 without departing from the scope of the present inventive concept.

In certain embodiments of the present inventive concept, the nitrogen doped layers may be formed by a plasma nitridation process. In particular, the integrated circuit substrate may be disposed in a process chamber. A plasma may be generated in the process chamber using, for example, $N_2$, $NH_3$, NO and/or $N_2O$, as a source gas. A plasma density within the process chamber may be set to about $1.0 \times 10^{10}/cm^3$ to about $1.0 \times 10^{12}/cm^3$ and a pressure within the process chamber may be set to from about 1.0 to about 300 mTorr. In certain embodiments, a temperature of the substrate may be set to from about 300 to about 900° C., and a plasma exposure time may be set to from about 10 seconds to about 60 seconds.

In further embodiments of the present inventive concept, the nitrogen doped layers may be formed by applying a remote plasma nitridation process (RPN). The RPN process is a method of jetting a nitrogen plasma into the process chamber after forming the plasma in remote chamber. The plasma exposure time of the substrate may be adjusted and the nitrogen doped layer with a high concentration may be formed at a surface of target materials. The plasma density within the process chamber of the RPN process may be set to from about $1.0 \times 10^{10}/cm^3$ to about $1 \times 10^{12}/cm^3$, and the pressure within the process chamber of the RPN process may be set to from about 1.0 to about 300 mTorr. Furthermore, the temperature of the substrate may be set to from about 300 to about 900° C., and the plasma exposure time may be set to from about 10 seconds to about 60 seconds.

In still further embodiments of the present inventive concept, the nitrogen doped layers may be formed by annealing the integrated circuit substrate in a gas including a nitrogen ambient. In these embodiments of the present inventive concept, nitrogen atoms combine with silicon atoms to form the nitrogen doped layers. The integrated circuit substrate may be heated at a temperature of from about 300 to about 900° C. The gas may include nitrogen and may be, for example, $N_2$, $NH_3$, NO and/or $N_2O$.

Furthermore, the nitrogen doped layers may be formed by combinations of annealing, plasma nitridation and/or remote plasma nitridation. The plasma nitridation process and the remote plasma nitridation process can be performed under lower temperature and during shorter exposure time than the annealing process.

Figure 7A:
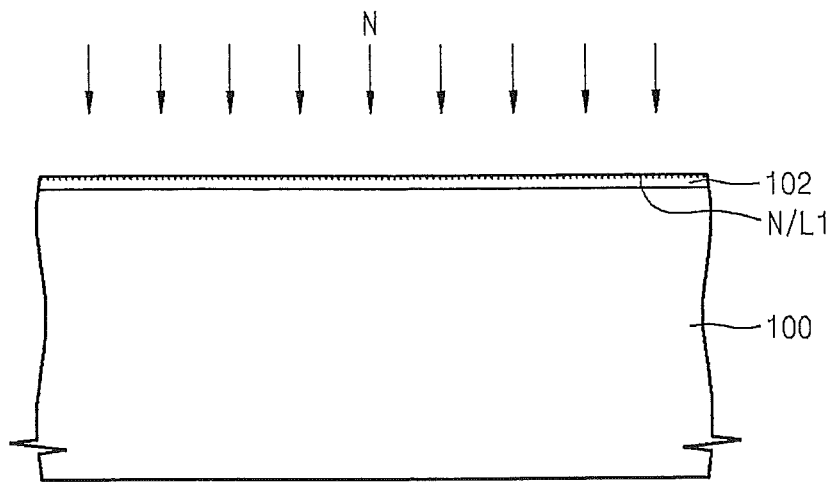
Figure 7B:
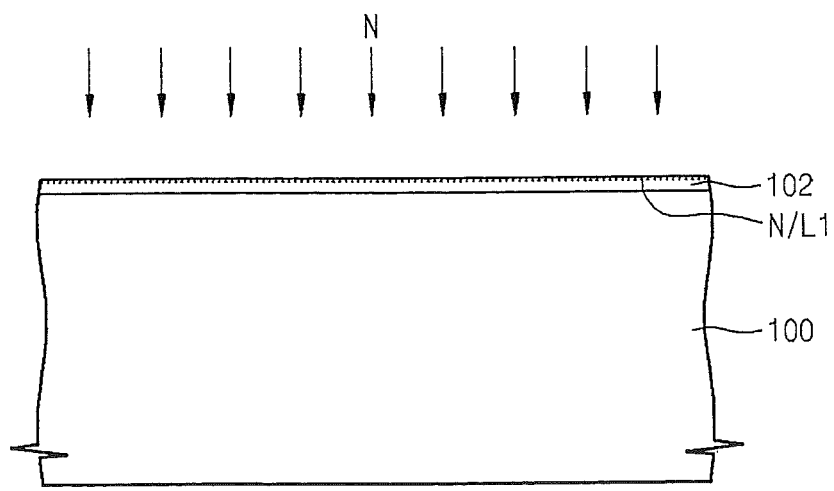

Referring now to FIGS. 7A through 18B, processing steps in the fabrication of nonvolatile memory devices according to some embodiments of the present inventive concept will be discussed. Referring now to FIGS. 7A and 7B, a tunnel insulating layer 102 is formed on the integrated circuit substrate 100. Nitrogen N may be doped into the tunnel insulating layer 102 to form a first nitrogen doped layer N/L1 on an upper surface of the tunnel insulating layer 102. It will be understood that the first nitrogen doped layer N/L1 may not be formed without departing from the scope of the present inventive concept. The nitrogen doped layer N/L1 may be formed by a plasma nitration process, a remote plasma nitridation process and/or by annealing the integrated circuit substrate in a gas including nitrogen ambient as discussed above.

Figure 8A:
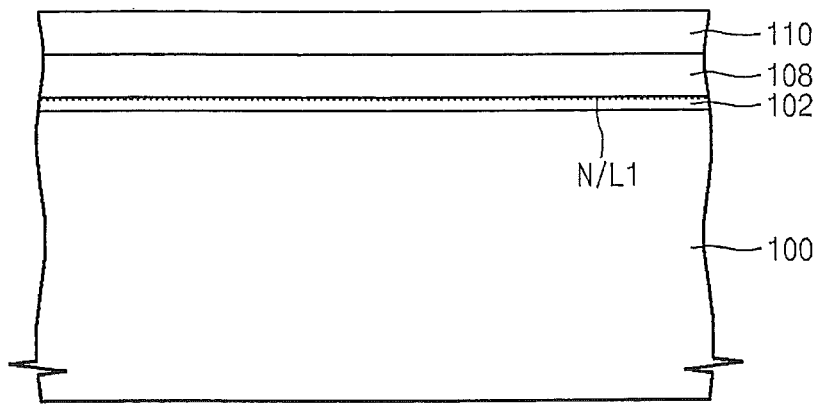
Figure 8B:
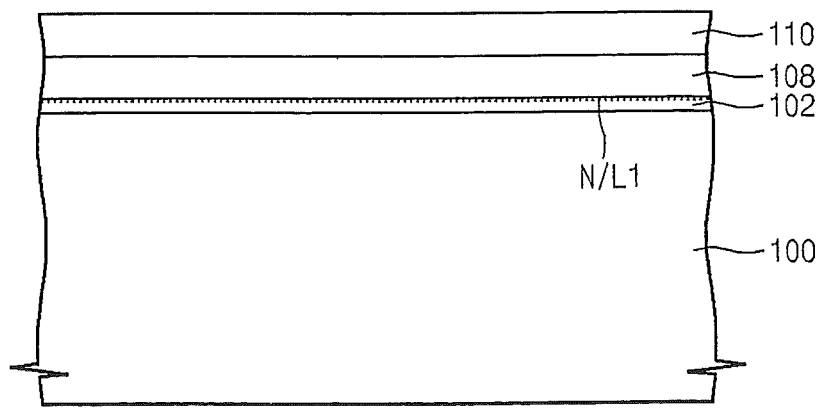

Referring now to FIGS. 8A and 8B, a lower conductive layer 108 and a hard mask layer 110 are sequentially stacked on the tunnel insulating layer 102. The lower conductive layer 108 may include, for example, polysilicon, and the hard mask layer 110 may include, for example, silicon nitride.

Figure 9A:
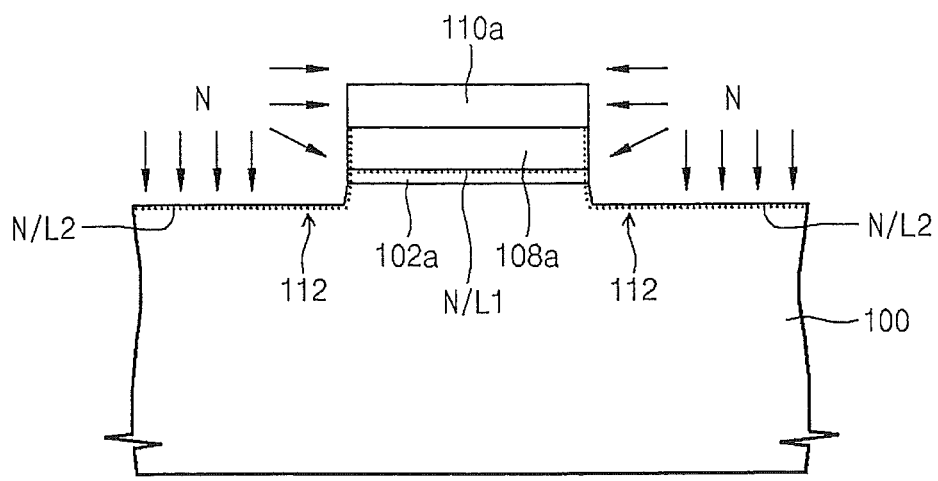
Figure 9B:
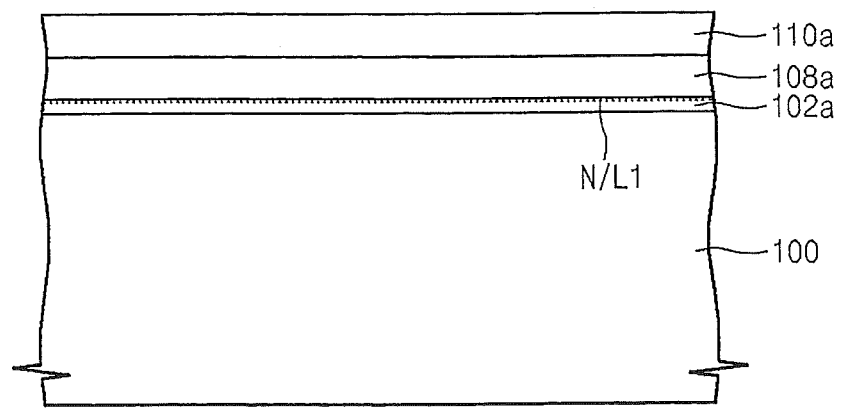

Referring now to FIGS. 9A and 9B, the hard mask layer 110, the lower conductive layer 108 and the tunnel insulating layer 102 are successively patterned to form a tunnel insulating pattern 102a, a lower conductive pattern 108a and a hard mask pattern 110a, which are sequentially stacked on the integrated circuit substrate 100. The lower conductive pattern 108a may include, for example, polysilicon. The integrated circuit substrate 100 is partially etched using, for example, the hard mask pattern 110a, as an etch mask to form a pre-trench region 112 aligned to sidewalls of the hard mask pattern 110a. The second nitrogen doped layer N/L2 is formed on sidewalls of the lower conductive pattern 108a and the tunnel insulating pattern 102a, and sidewalls and a bottom of the pre-trench region 112. The second nitrogen doped layer N/L2 may be formed by the plasma nitridation process, the remote plasma nitridation process and/or by annealing the substrate in a gas including nitrogen ambient as discussed above.

Figure 10A:
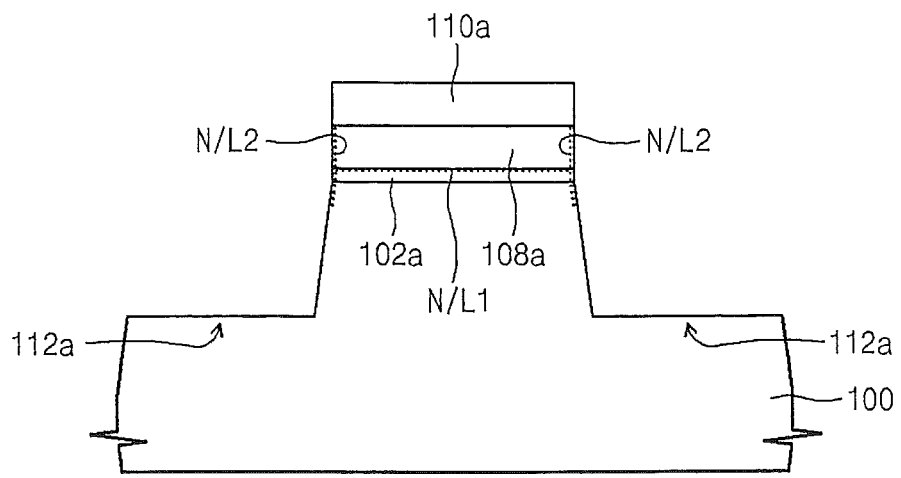
Figure 10B:
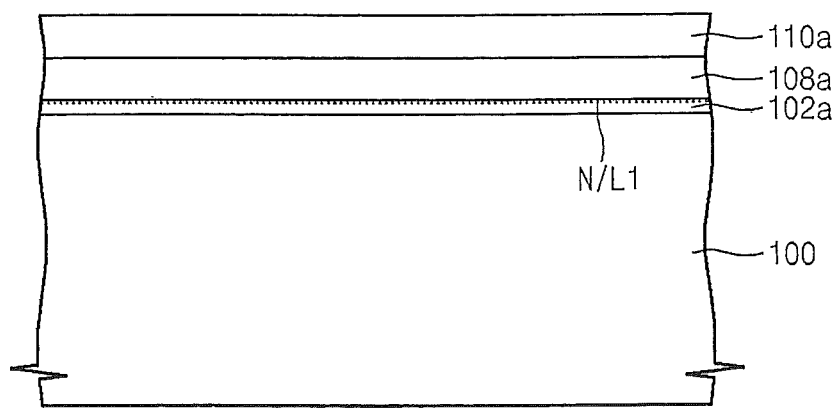

Referring now to FIGS. 10A and 10B, the integrated circuit substrate 100 is etched using, for example, the hard mask pattern 110a as the etch mask, to form a trench region 112a aligned to the sidewalls of the hard mask pattern 110a. The second nitrogen doped layer N/L2 remains on the sidewalls of the lower conductive pattern 108a, the sidewalls of the tunnel insulating pattern 102a and an upper portion of the sidewalls of the trench region 112a.

Figure 11A:
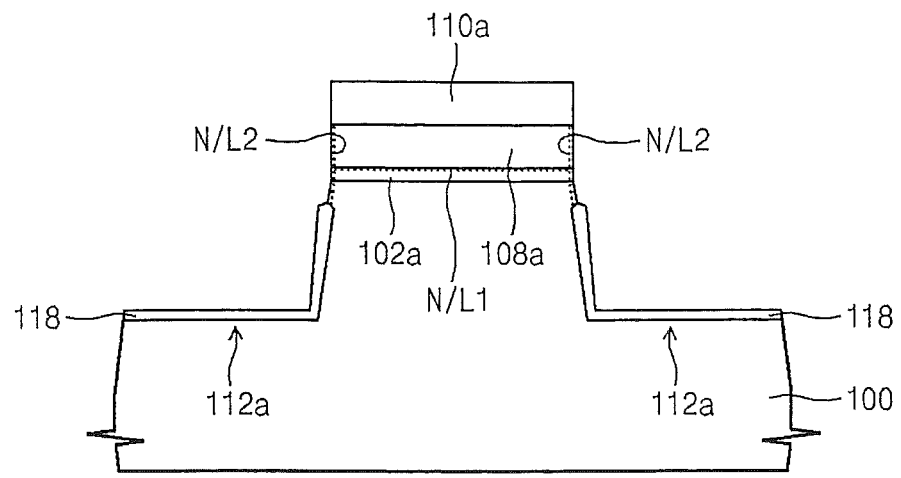
Figure 11B:
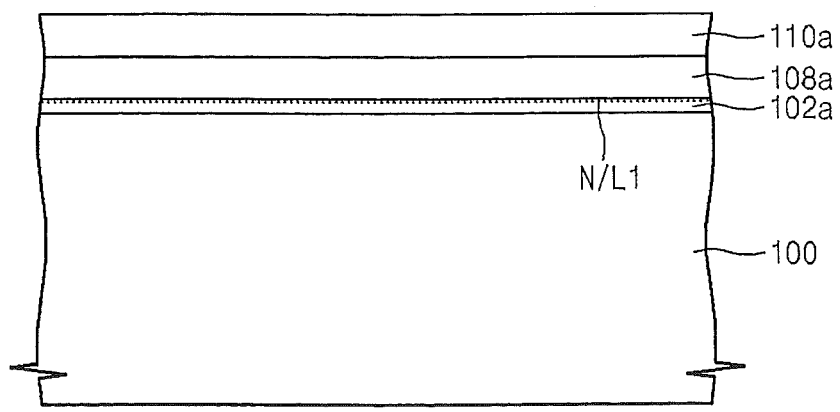

Referring now to FIGS. 11A and 11B, a thermal oxidization process is applied to the integrated circuit substrate 100, for example, to cure etch damage that may have occurred during the etch of the trench region 112a. A trench oxide layer 118 is formed on sidewalls and a bottom of the trench region 112a. As illustrated, the trench oxide layer 118 may not be formed on the upper portion of the sidewalls of the trench region 112a, i.e., the trench oxide layer may not be formed on the second nitrogen doped layer N/L2.

The second nitrogen doped layer N/L2 formed on the sidewalls of the lower conductive pattern 108a and the tunnel insulating pattern 102a, and the upper portion of the sidewalls of the trench region 112a may reduce the amount of oxygen atoms diffused into interfaces between the lower conductive pattern 108a, the tunnel insulating pattern 102a and the integrated circuit substrate 100. The second nitrogen doped layer N/L2 may reduce the likelihood that oxygen atoms will react with silicon atoms of the integrated circuit substrate 100 and the lower conductive pattern 108a. Thus, as discussed above, it may be possible to reduce that likelihood of the formation of a bird's beak, i.e., thickening of the edge of the tunnel insulating pattern 102a. Furthermore, the first nitrogen doped layer N/L1 formed in the upper surface of the tunnel insulating pattern 102a may reduce the likelihood that the lower conductive pattern 108a will be oxidized. In certain embodiments of the present inventive concept, the lower conductive pattern 108a may include polysilicon, which may be oxidized more easily as compared with a single crystalline silicon.

Figure 12A:
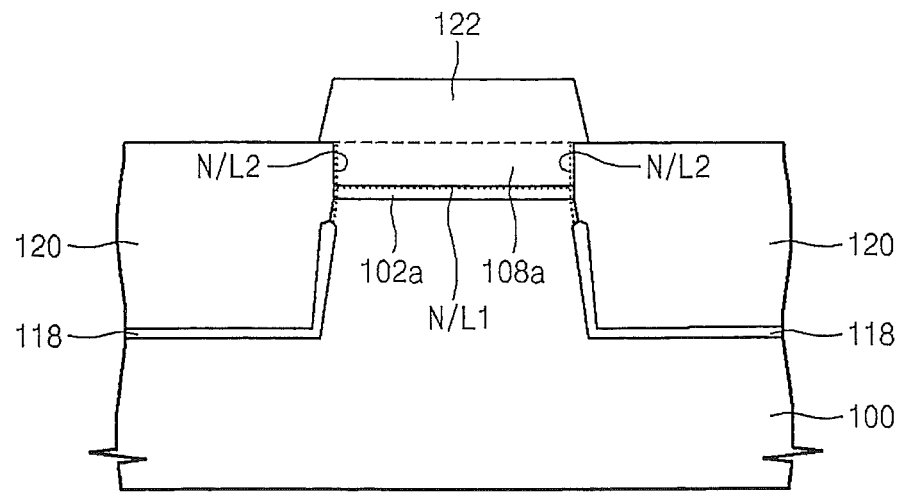
Figure 12B:
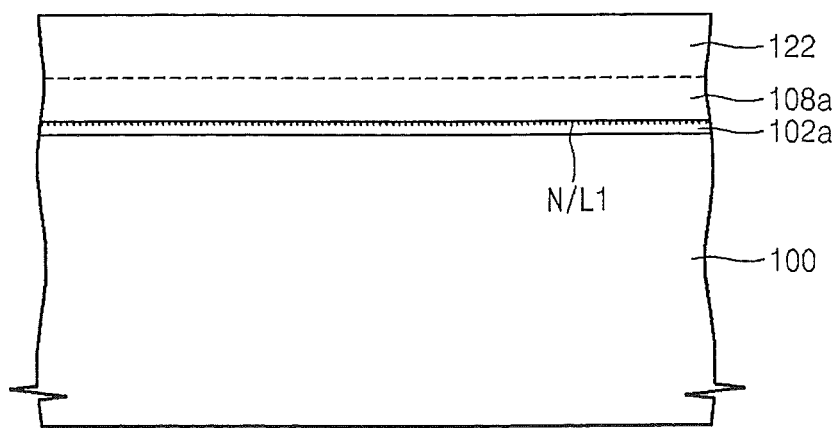

Referring now to FIGS. 12A and 12B, an insulating layer is formed on a surface of the integrated circuit substrate 100. The insulating layer is planarized by, for example, a chemical mechanical polishing (CMP) process until at least a portion of the hard mask pattern 110a is exposed, thereby forming an insulating pattern 120 in the trench region 113a. The hard mask pattern 110a may be removed. The insulating pattern 120 and the trench oxide layer 118 constitute a device isolation pattern. The insulating layer may include a single layer or multiple layers. For example, the insulating layer may include a silicon oxide layer, such as a high-density plasma oxide layer or a plasma enhanced oxide layer (PEOX). The high-density plasma oxide layer and the plasma enhanced oxide layer typically have an excellent step coverage characteristic. In certain embodiments of the present inventive concept, a thin silicon nitride layer may be formed before the oxide layer is formed.

A conductive layer is formed on the surface of the integrated circuit substrate 100. The conductive layer is patterned to form an upper conductive pattern 122 on the lower conductive pattern 108a. The upper conductive pattern 122 may include, for example, polysilicon, similar to the lower conductive pattern 108a. As illustrated, an edge of the upper conductive pattern 122 may extend on a surface of the insulating pattern 120, for example, an oxide pattern, which may reduce a damage of the lower conductive pattern 108a by a misalign of the upper conductive pattern 122.

Figure 13A:
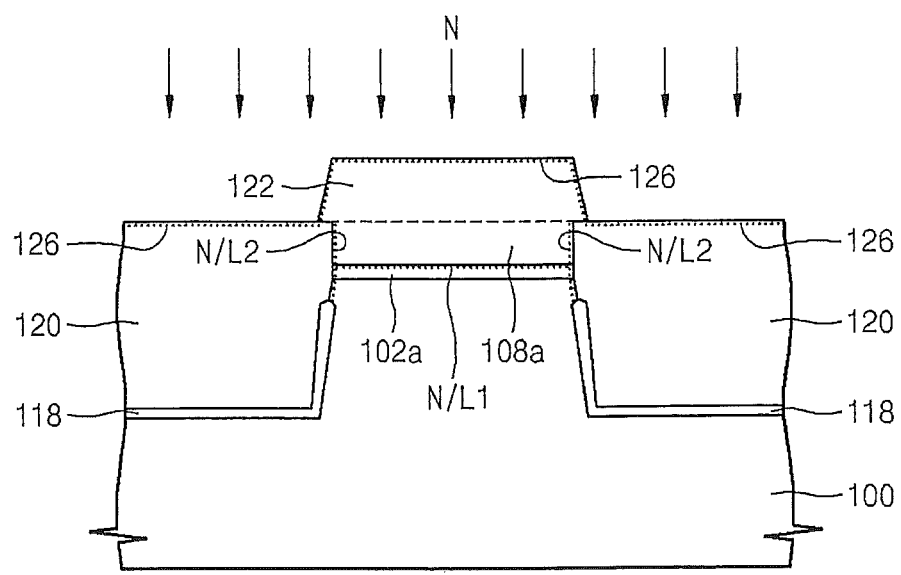
Figure 13B:
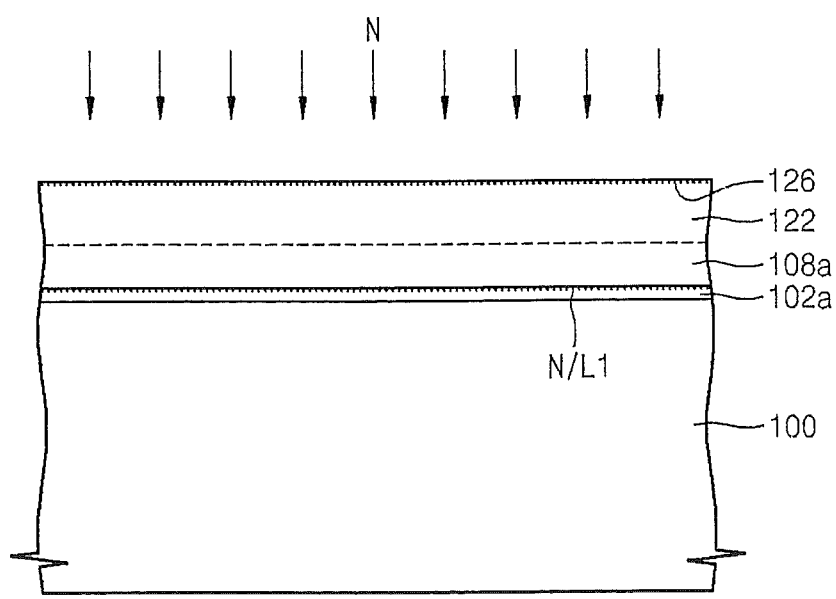
Figure 14A:
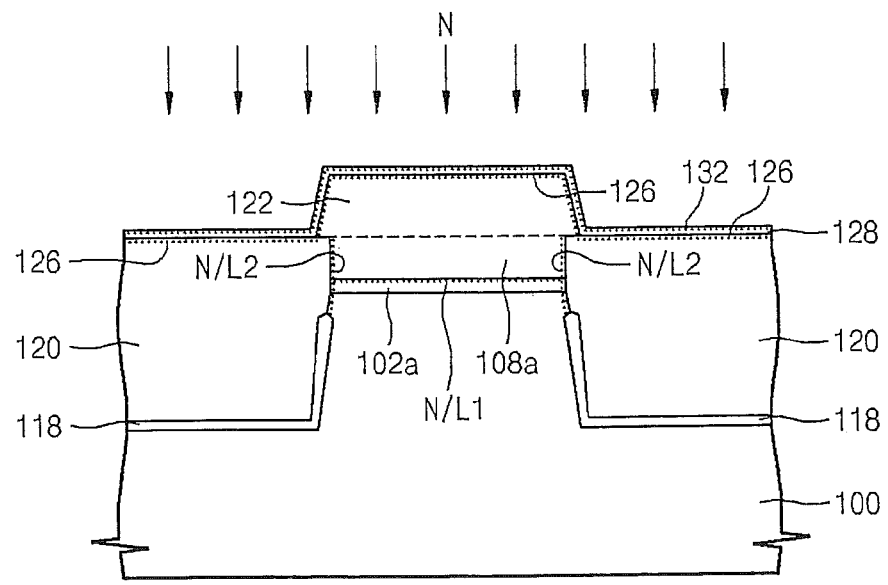
Figure 14B:
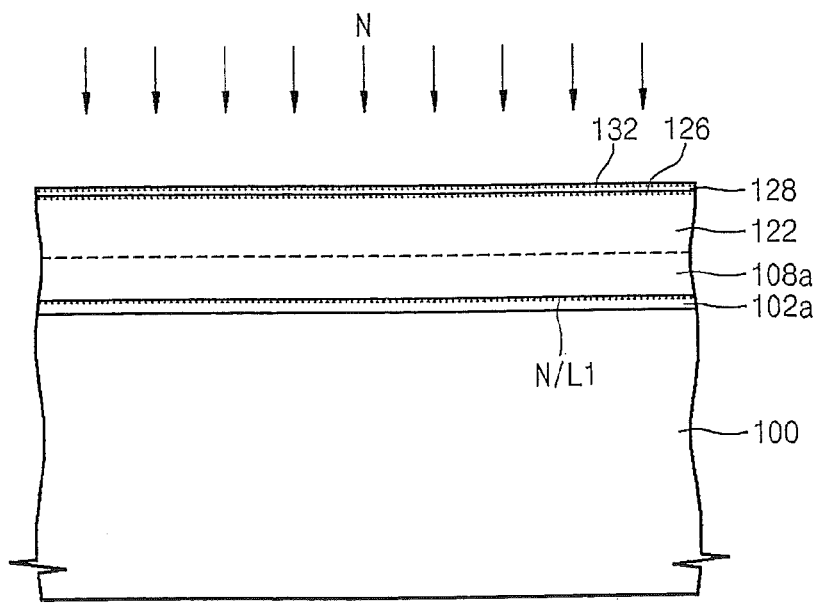

Referring to now to FIGS. 13A and 13B, nitrogen N ions are implanted in the upper conductive pattern 112 to form a nitrogen doped layer 126. The nitrogen doped layer 126 is formed on an upper surface and sidewalls of the upper conductive pattern 122 and an upper surface of the insulating pattern 120. As illustrated in FIGS. 14A and 14B, a first silicon oxide layer 128 is conformally formed on the nitrogen doped layer 126. A nitrogen doped layer 132 is formed in an upper surface of the first silicon oxide layer 128.

Figure 15A:
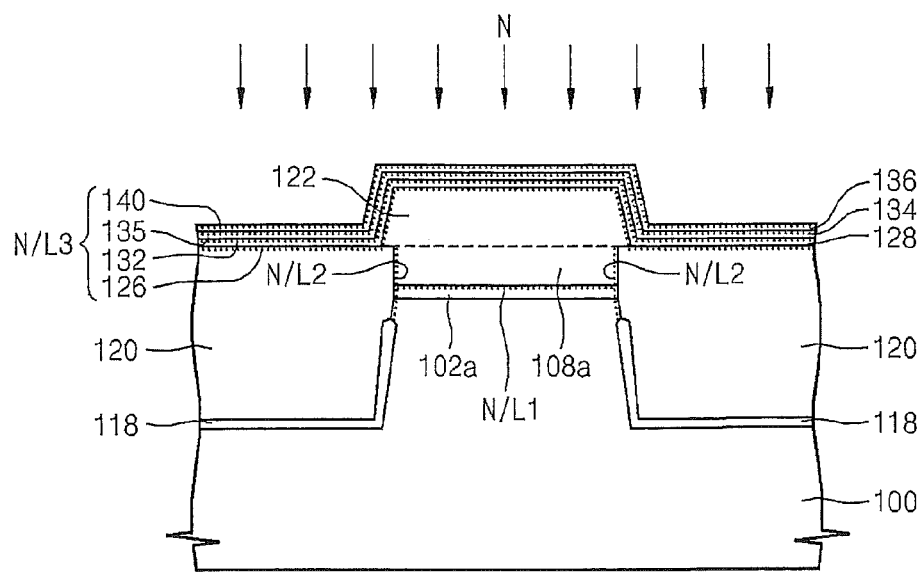
Figure 15B:
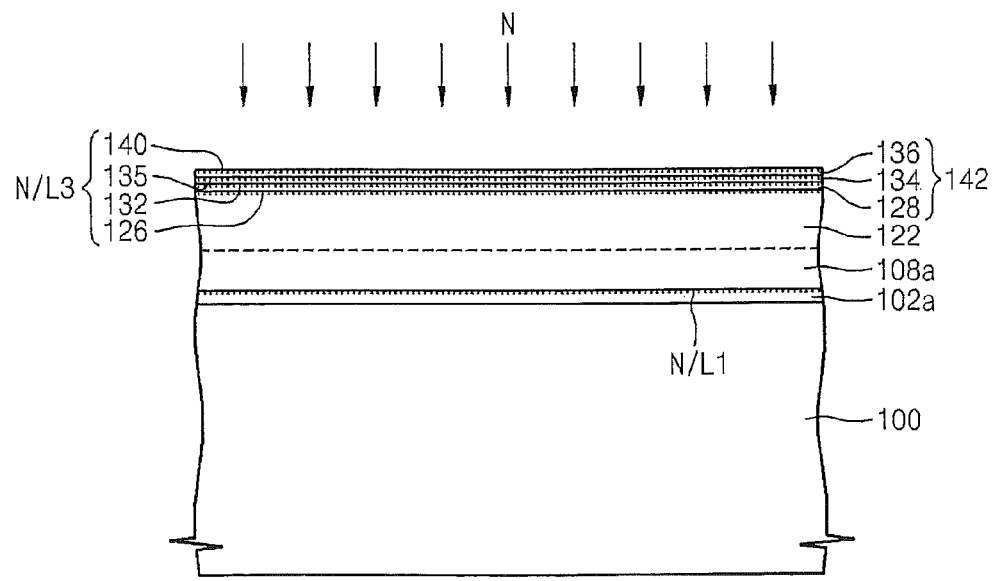

Referring now to FIGS. 15A and 15B, a silicon nitride layer 134 is formed on the nitrogen doped layer 132 of the first silicon oxide layer 128. A nitrogen doped layer 135 may be formed on an upper surface of the silicon nitride layer 134. A second silicon oxide layer 136 is formed on the silicon nitride layer 134. A nitrogen doped layer 140 is formed on an upper surface of the second silicon oxide layer 136. A blocking insulating layer 142 may include the first silicon oxide layer 128, the silicon nitride layer 134 and the second silicon oxide layer 136. A third nitrogen doped layer N/L3 including the nitrogen doped layers 126, 132, 135, and 140 may be formed by the plasma nitridation process, the remote plasma nitridation process and/or by annealing the substrate in a gas including nitrogen ambient as discussed above.

The blocking insulating layer 142 may include an insulating layer, capable of reducing the likelihood of leakage of electrons from the floating gate pattern to the control gate electrode. The blocking insulating layer 142 may include at least one insulating layer having a higher dielectric constant than a tunnel insulating pattern. The blocking insulating layer 142 may include at least one insulating layer including, for example, silicon oxide, silicon nitride, $Al_2O_3$, a hafnium aluminate, hafnium silicate, $HfO_2$, HfAlO, HfAlON, HfSiO, HfSiON, or any combination thereof. The third nitrogen doped layer N/L3 may be formed in an upper surface of one or more of the at least one insulating layer constituting the blocking insulating pattern 142a. The nitrogen doped layer may not be formed on an upper surface of the nitride layers, for example, a silicon nitride, HfAlON, HfSiON without departing from the scope of the present inventive concept.

Figure 16A:
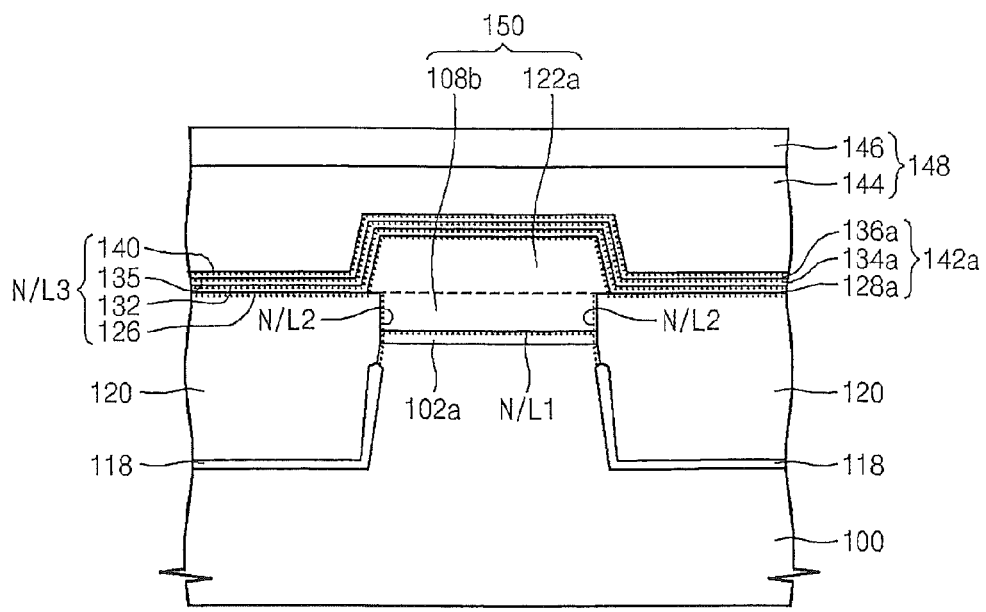
Figure 16B:
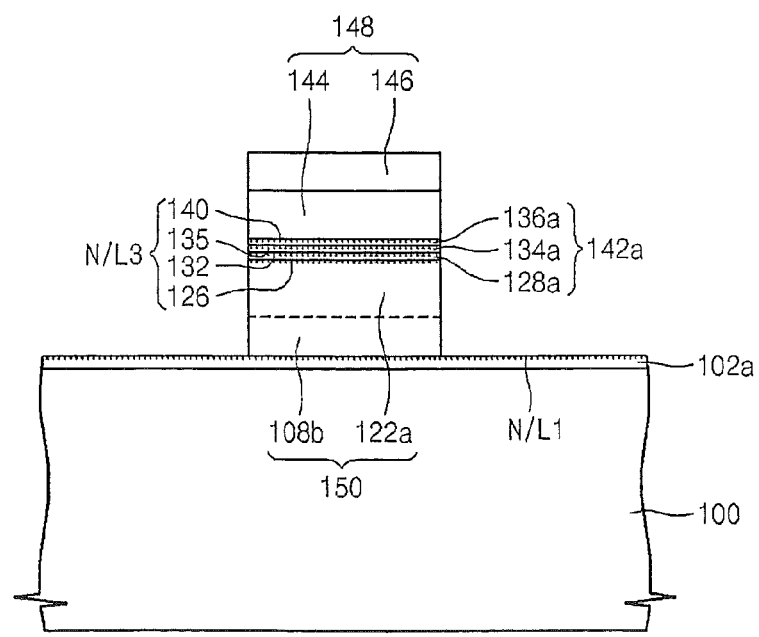
Figure 17A:
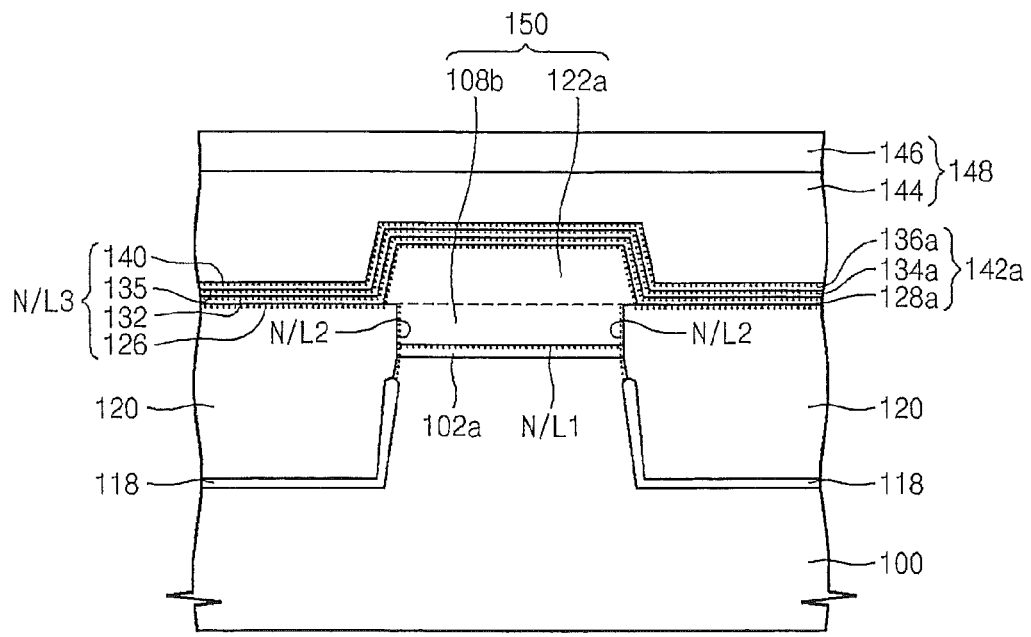
Figure 17B:
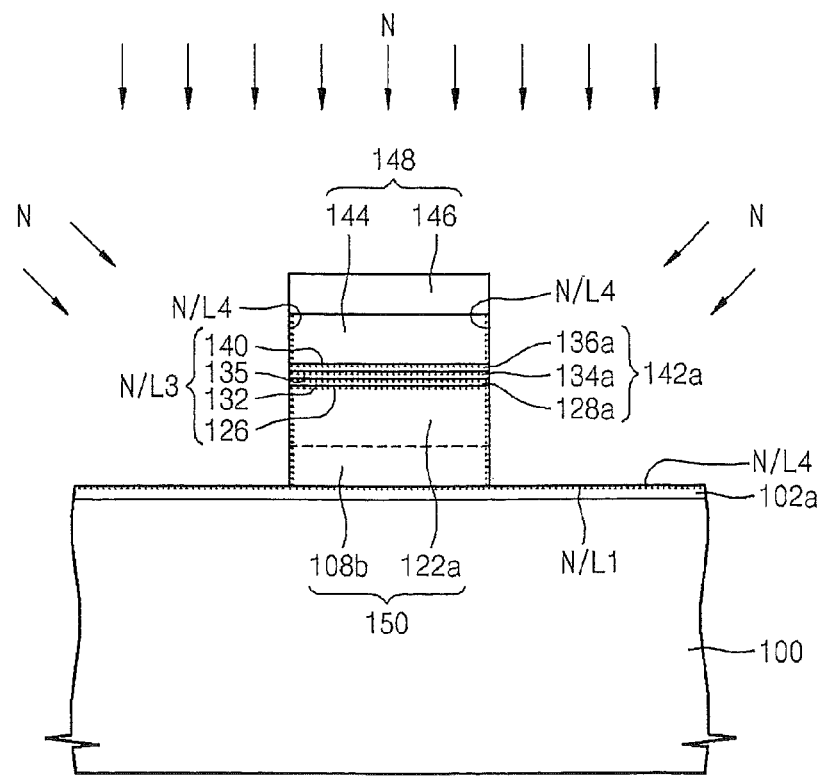
Figure 18A:
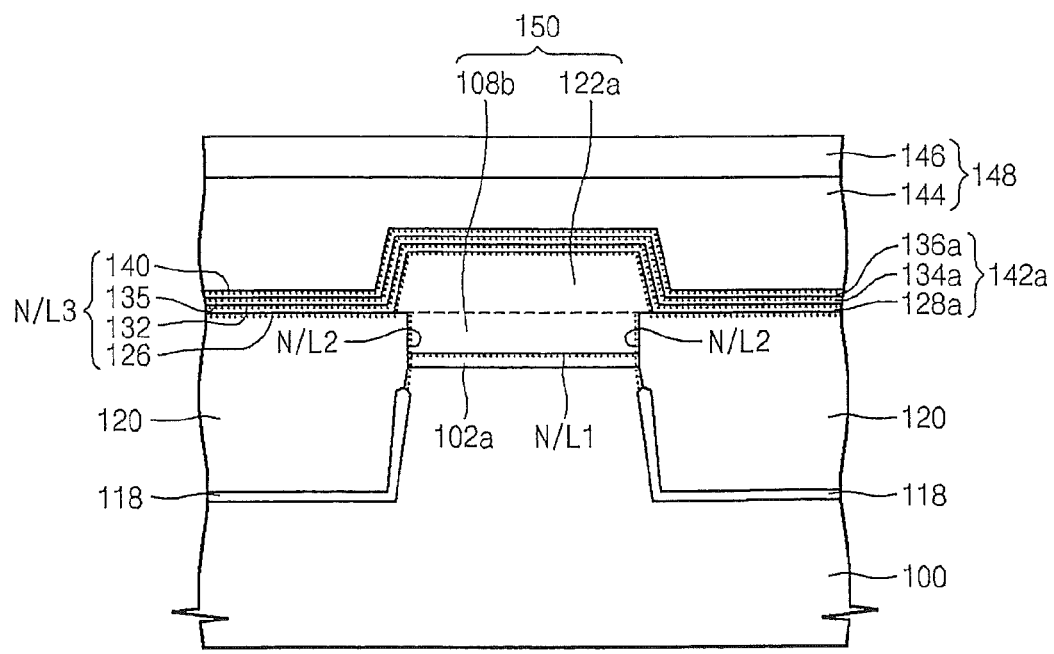
Figure 18B:
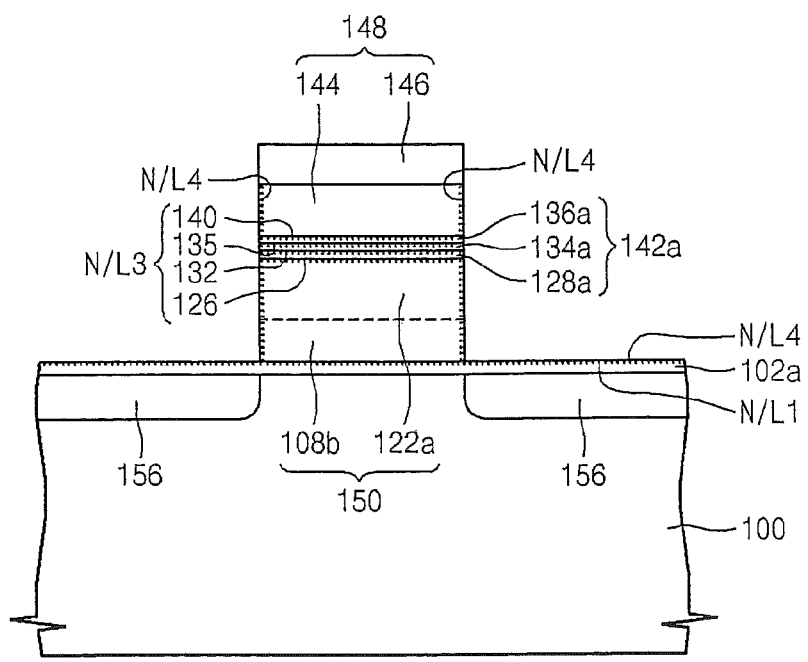
Figure 19A:
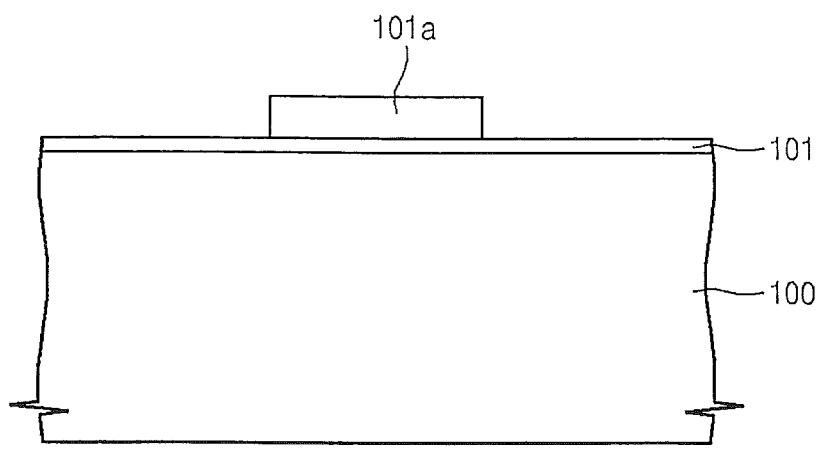
Figure 19B:
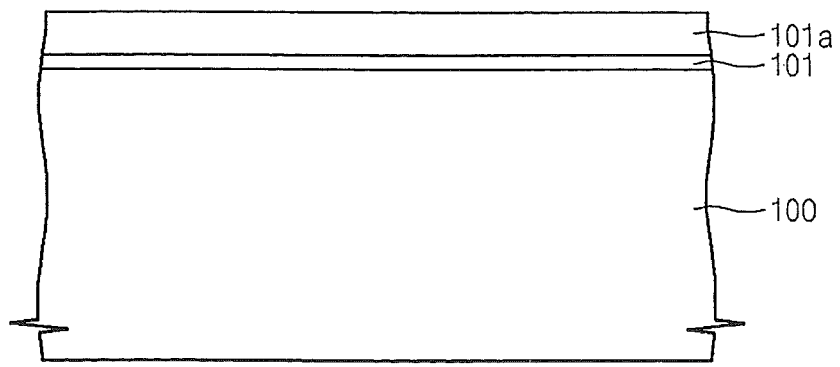

Referring now to FIGS. 16A and 16B, a gate conductive layer is formed on the blocking insulating layer 142. The gate conductive layer, the blocking insulating layer 142, the upper conductive pattern 122 and the lower conductive pattern 108a are patterned to form a stack gate structure crossing over the device isolation pattern. The stack gate structure includes a floating gate pattern 150, a blocking insulating pattern 142a on the floating gate pattern 150 and a control gate pattern 148 on the blocking insulating pattern 142a. The tunnel insulating pattern 102a between the stack gate structures may not be etched during formation of the stack gate structure. The control gate electrode 148 may include polysilicon or a polycide layer that includes a polysilicon layer 144 and a metal silicide layer 146 as illustrated in the Figures. The floating gate pattern 150 may include a lower gate pattern 108a and an upper gate pattern 112a on the lower gate pattern.

Referring now to FIGS. 17A through 18B, nitrogen N ions are implanted in sidewalls of the stack gate structure and on the surface of the tunnel insulating pattern 102a to form a forth nitrogen doped layer N/L4. The forth nitrogen doped layer N/L4 may be formed by the plasma nitridation process, the remote plasma nitridation process and/or by annealing the substrate in a gas including nitrogen ambient as discussed above. In some embodiments of the present inventive concept, the tunnel insulating pattern 102a may be patterned to remain only under the floating gate pattern 150 during formation of the gate stack structure. In these embodiments of the present inventive concept, the forth nitrogen doped layer N/L4 may be formed on sidewalls of the tunnel insulating pattern between the floating gate pattern 150 and the integrated circuit substrate 100. Thus, it may be possible to reduce the likelihood that oxygen atoms will be diffused through the sidewalls of the tunnel insulating pattern 102a. A gate sidewall oxidation process may be performed to cure the etch damage of the sidewalls of the stack gate structure. During the gate sidewall oxidation process, the integrated circuit substrate 100 may be annealed. Thus, the amount of oxygen atoms may be diffused into interfaces between the floating gate pattern 150, the blocking insulating pattern 142a and the control gate electrode 148, to form a bird's beak, i.e., thickening of the edges of the blocking insulating pattern 142a and the tunnel insulating pattern 102a. However, the forth nitrogen doped layers N/L4 formed on the sidewalls of the stack gate structure may reduce the amount of oxygen atoms diffused into interfaces between the floating gate pattern 150, the blocking insulating pattern 142a and the control gate electrode 148, whereby the bird's beak may be reduced.

Source and drain regions S/D may be formed on the integrated circuit substrate adjacent to the stack gate structure. It will be understood that any subsequent process may be performed using methods known to those having skill in the art.

Referring now to FIGS. 19 through 29, processing steps in the fabrication of nonvolatile memory devices according to further embodiments of the present inventive concept will be discussed. Referring first to FIGS. 19A and 19B, a pad oxide layer 101 is formed on an integrated circuit substrate 100 and a hard mask pattern 101a is formed on the pad oxide layer 101. The pad oxide layer 101 may include a thermal oxide layer, and the hard mask pattern 101a may include a silicon nitride layer.

Figure 20A:
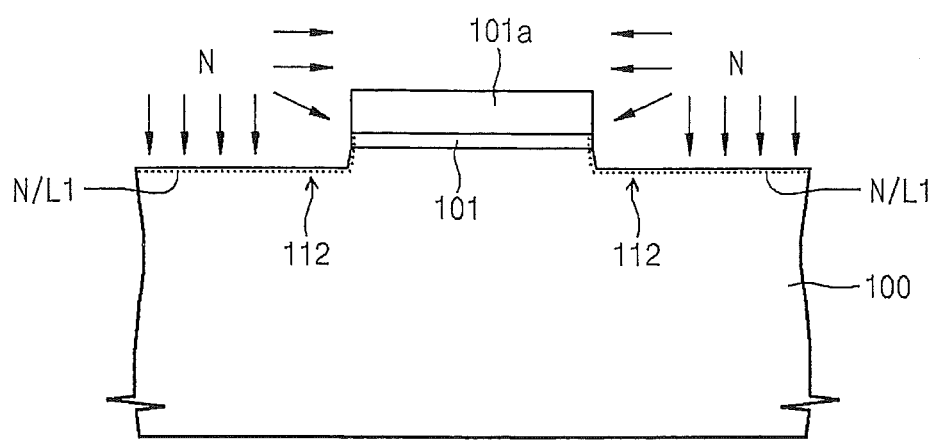
Figure 20B:
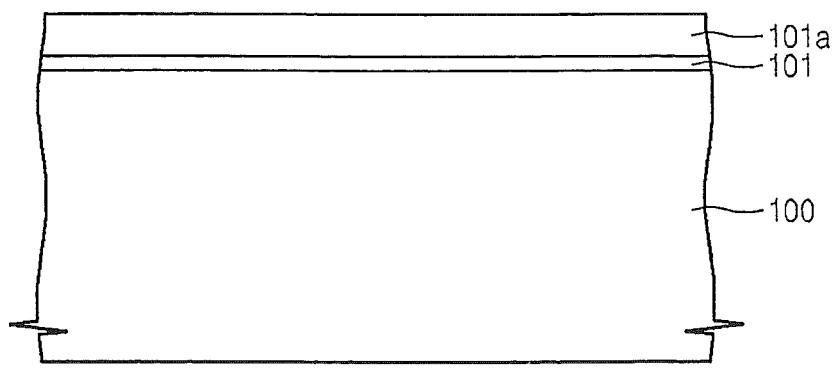

Referring now to FIGS. 20A and 20B, the integrated circuit substrate 100 is partially etched using, for example, the hard mask pattern 101a, as an etch mask to form a pre-trench region 112 aligned to sidewalls of the hard mask pattern 101a. The first nitrogen doped layer N/L1 is formed on sidewalls and a bottom of the pre-trench region 112. The first nitrogen doped layer N/L1 may be formed by the plasma nitridation process, the remote plasma nitridation process and/or by annealing the substrate in a gas including nitrogen ambient as discussed above.

Figure 21A:
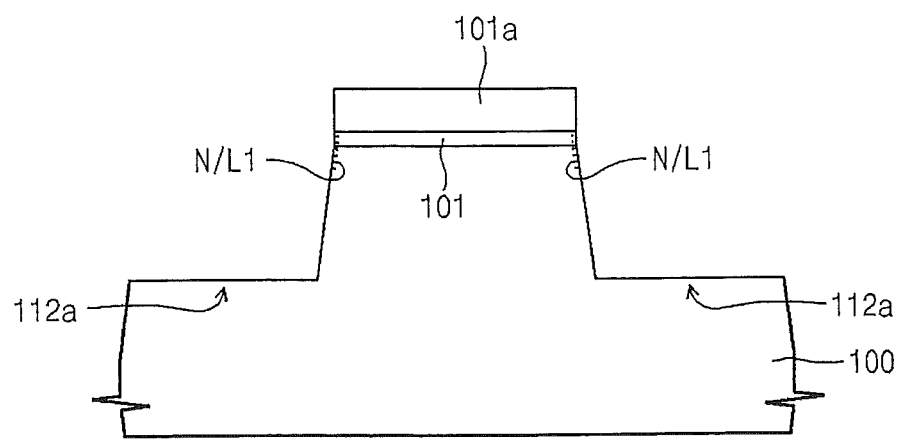
Figure 21B:
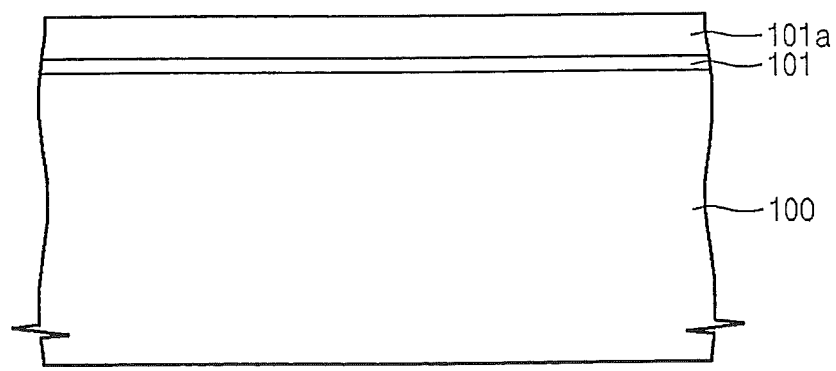

Referring now to FIGS. 21A and 21B, the integrated circuit substrate 100 is etched using, for example, the hard mask pattern 101a as the etch mask, to form a trench region 112a aligned to the sidewalls of the hard mask pattern 101a. The first nitrogen doped layer N/L1 remains in an upper portion of sidewalls of the trench region 112a.

Figure 22A:
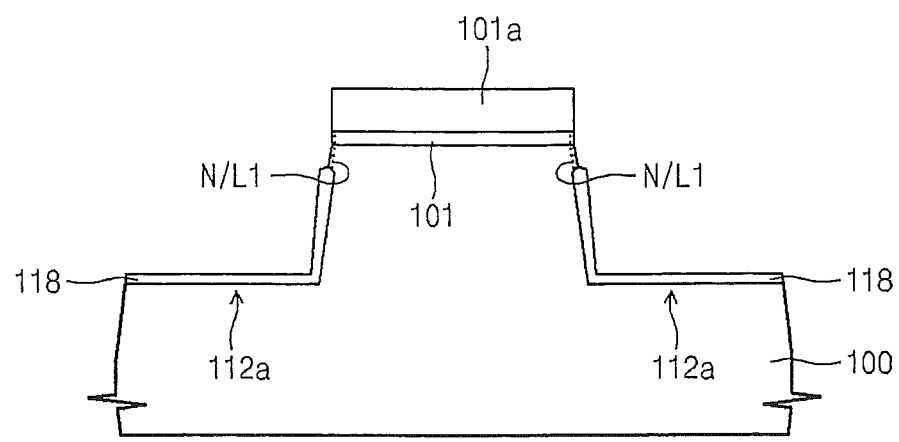
Figure 22B:
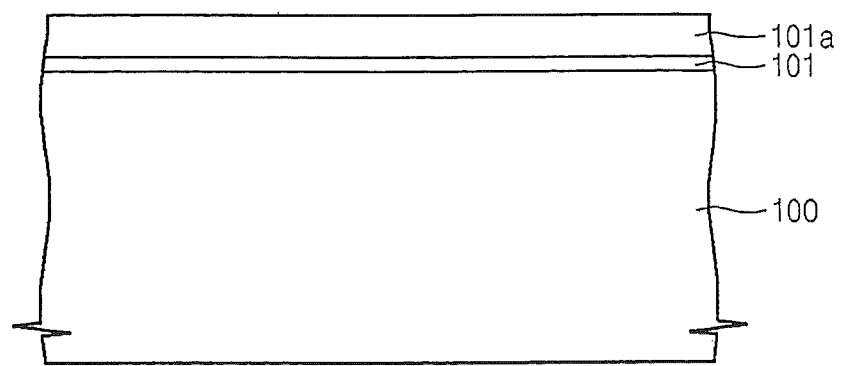

Referring now to FIGS. 22A and 22B, a thermal oxidation process is applied to the integrated circuit substrate 100, for example, to cure any etch damage that may have occurred during the etch of the trench region 112a. A trench oxide layer 118 is formed on sidewalls and a bottom of the trench region 112a. As illustrated, the trench oxide layer 118 may not be formed on the upper portion of the sidewalls of the trench region 112a, i.e., the trench oxide layer 118 may not be formed on the first nitrogen doped layer N/L1.

The first nitrogen doped layer N/L1 formed on the upper portion of the sidewalls of the trench region 112a may reduce the amount of oxygen atoms diffused into an interface between the pad oxide layer 101 and the integrated circuit substrate 100. The first nitrogen doped layer N/L1 may reduce the likelihood that oxygen atoms will react with silicon atoms of the integrated circuit substrate. Thus, as discussed above, it may be possible to reduce a formation of a bird's beak, i.e., thickening of the edge of the pad oxide layer 101, and rounding of a corner of the integrated circuit substrate adjacent to the trench region 112a.

Figure 23A:
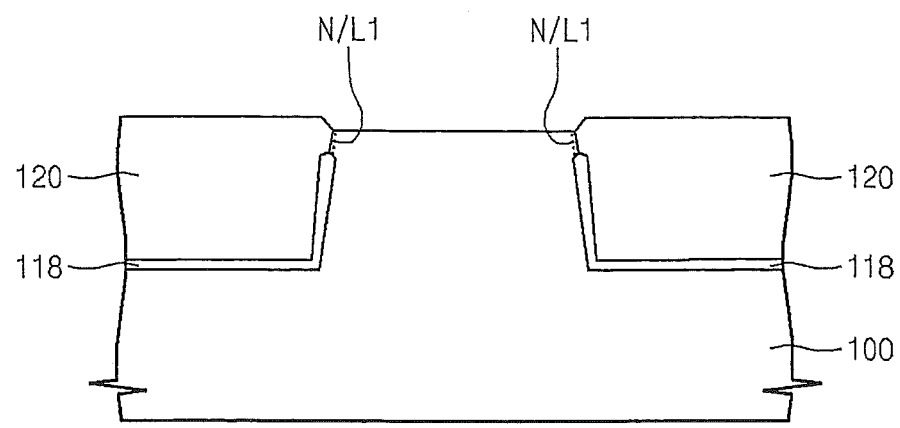
Figure 23B:
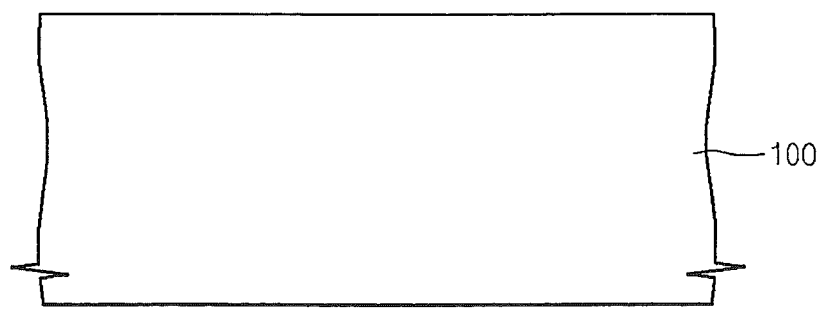

Referring now to FIGS. 23A and 23B, an insulating layer is formed on a surface of the integrated circuit substrate 100. The insulating layer is planarized by, for example, a chemical mechanical polishing (CMP) process, to expose at least a portion of the hard mask pattern 101a. The planarized insulating layer may be recessed by further etching process to form an insulating pattern 120 in the trench region 112a. The hard mask pattern 101a may be removed. The insulating pattern 120 and the trench oxide layer 118 constitute a device isolation pattern. The insulating layer may include a single layer or multiple layers. For example, the insulating layer may include a silicon oxide layer such as a high-density plasma oxide layer or a plasma enhanced oxide layer (PEOX). The high-density plasma oxide layer and the plasma enhanced oxide layer typically have an excellent step coverage characteristic. In certain embodiments of the present inventive concept, a thin silicon nitride layer may be formed before the oxide layer is formed.

Figure 24A:
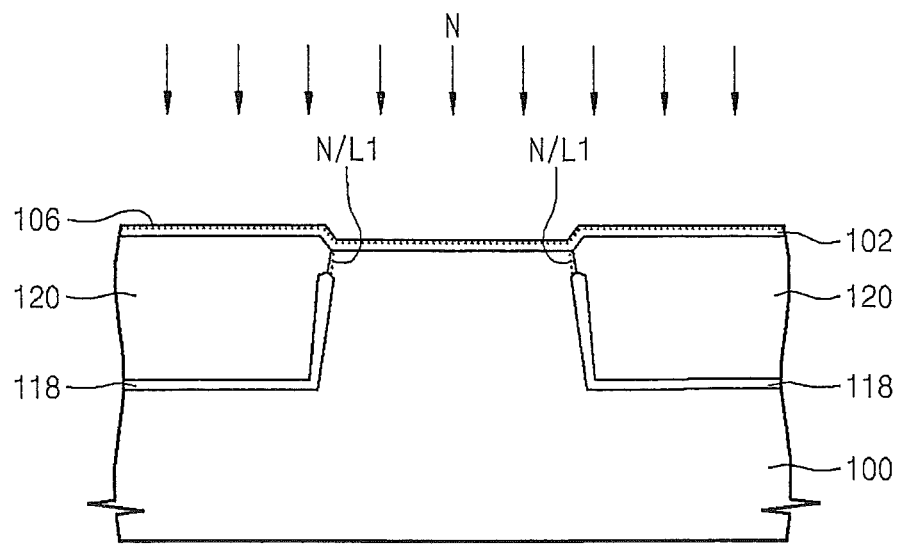
Figure 24B:
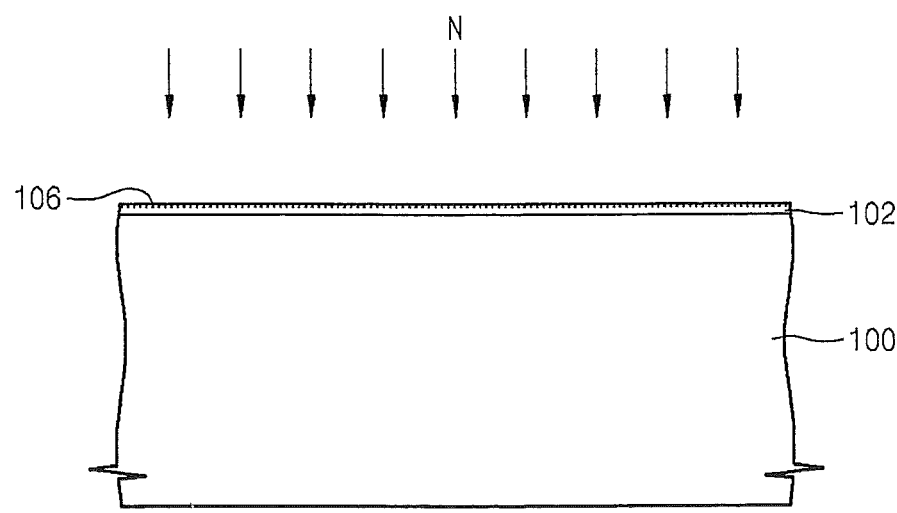

Referring to now to FIGS. 24A and 24B, a tunnel insulating layer 102 is formed on a surface of the integrated circuit substrate 100 and the insulating pattern 120. The tunnel insulating layer 102 may include, for example, silicon oxide, $Al_2O_3$, or $HfO_2$. The tunnel insulating layer 102 may be deposited by using a thermal oxidation, an atomic layer deposition or a chemical vapor deposition. Nitrogen N ions are implanted in the tunnel insulating layer 102 to form a first nitrogen doped layer 106.

Figure 25A:
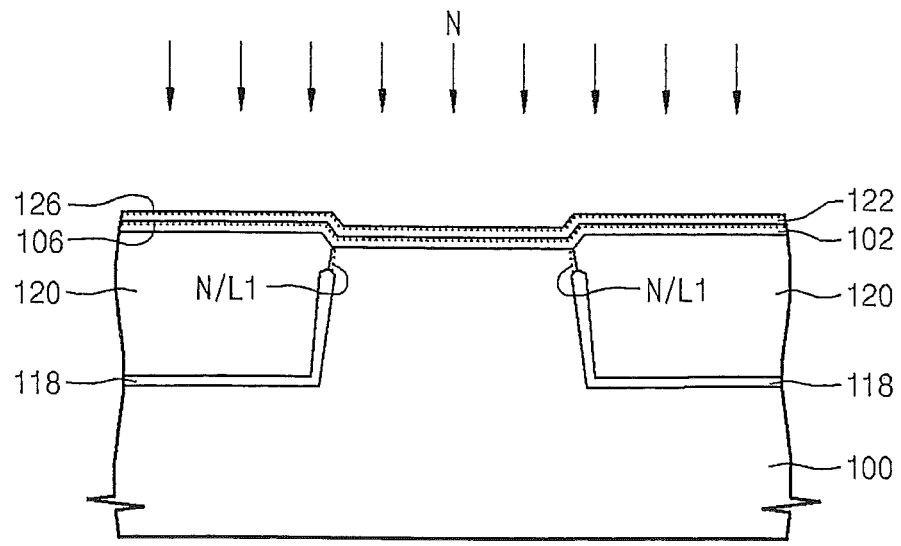
Figure 25B:
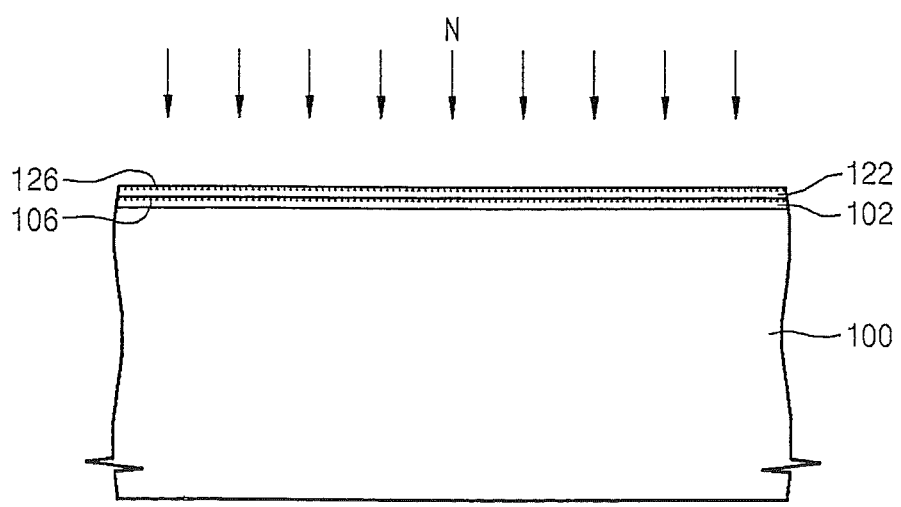

Referring now to FIGS. 25A and 25B, a charge storage layer 122 is formed on the nitrogen doped layer 106 of the tunnel insulating layer 102. The charge storage layer 122 may include a dot layer, a charge trap layer, or any combination thereof. The dot layer may include, for example, a conducting material of a dot shape or an insulating material of a dot shape. The charge trap layer may include at least one layer including silicon nitride, $Al_2O_3$, hafnium aluminate, hafnium silicate, $HfO_2$, HfAlO, HfAlON, HfSiO, HfSiON, or any combination thereof. A nitrogen doped layer 126 may be formed on an upper surface of one or more of the at least one layer constituting the charge storage layer 122. Furthermore, the nitrogen doped layer 126 may be formed on an upper surface at least one of the layers constituting the charge storage layer 122. In some embodiments of the present inventive concept, the nitrogen doped layer may not be formed on an upper surface of the nitride layers, i.e., silicon nitride, HfAlON, HfSiON, constituting the charge storage layer 122, without departing from the scope of the present inventive concept.

Figure 25C:
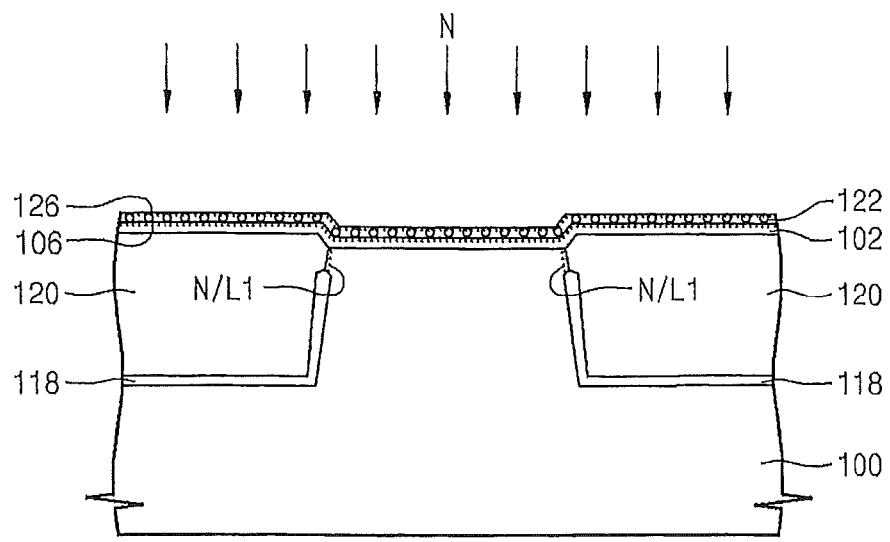
Figure 25D:
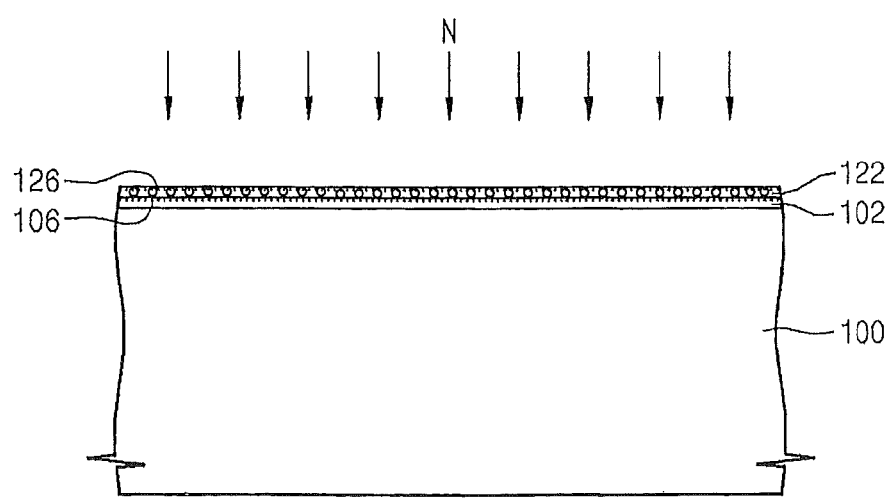
Figure 26A:
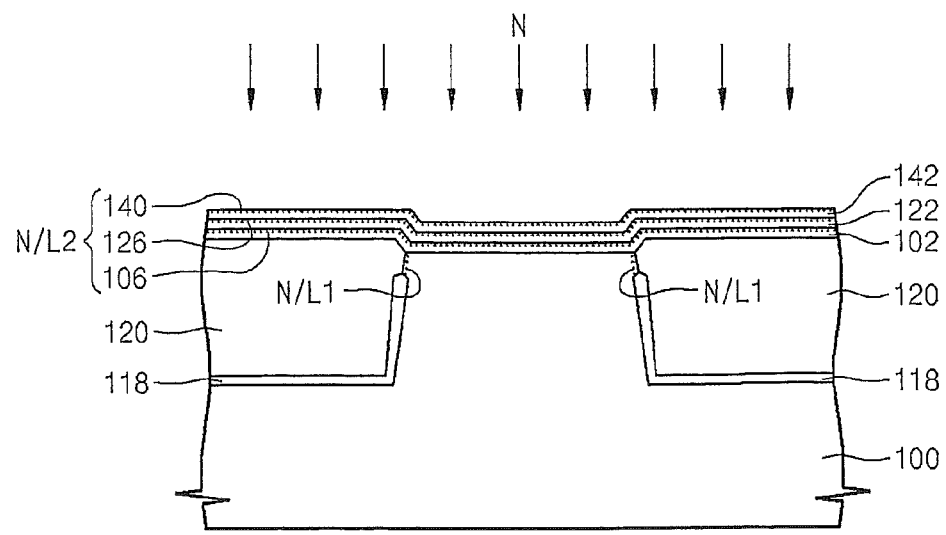
Figure 26B:
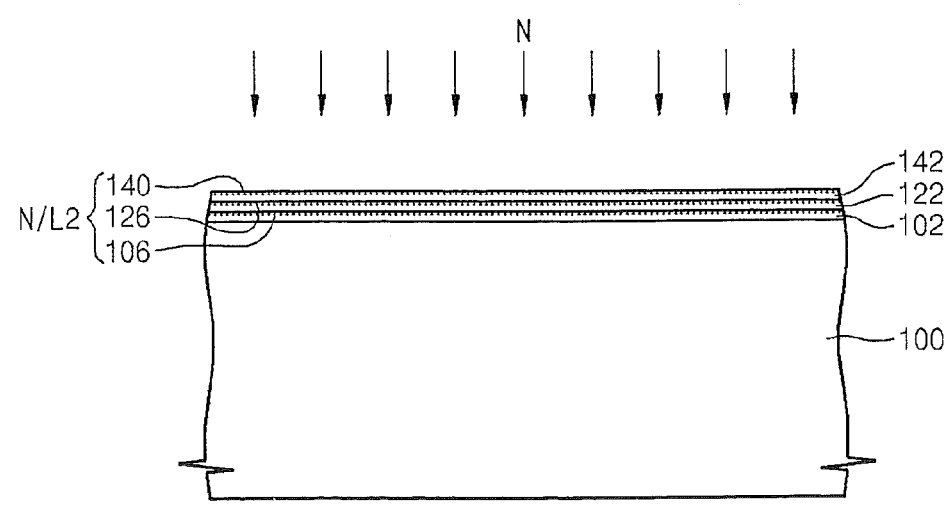

Referring now to FIGS. 25A and 25B, a charge storage layer 122 is formed on the nitrogen doped layer 106 of the tunnel insulating layer 102. The charge storage layer 122 may include a dot layer, a charge trap layer, or any combination thereof. The dot layer may include, for example, a conducting material of a dot shape or an insulating material of a dot shape, as shown in FIGS. 25C and 25D. The charge trap layer may include at least one layer including silicon nitride, Al2O3, hafnium aluminate, hafnium silicate, HfO2, HfAlO, HfAlON, HfSiO, HfSiON, or any combination thereof. A nitrogen doped layer 126 may be formed on an upper surface of one or more of the at least one layer constituting the charge storage layer 122. Furthermore, the nitrogen doped layer 126 may be formed on an upper surface at least one of the layers constituting the charge storage layer 122. In some embodiments of the present inventive concept, the nitrogen doped layer may not be formed on an upper surface of the nitride layers, i.e., silicon nitride, HfAlON, HfSiON, constituting the charge storage layer 122, without departing from the scope of the present inventive concept.

The tunnel insulating layer 102, the charge storage layer 122 and/or the blocking insulating layer 142 may be formed only on the active region between adjacent insulating patterns 120. The tunnel insulating layer 102, the charge storage layer 122 and/or the blocking insulating layer 142 may be patterned to form a tunnel insulating pattern, a charge storage pattern and/or a blocking insulating pattern to be aligned a sidewall of the insulating patterns 120.

Figure 27A:
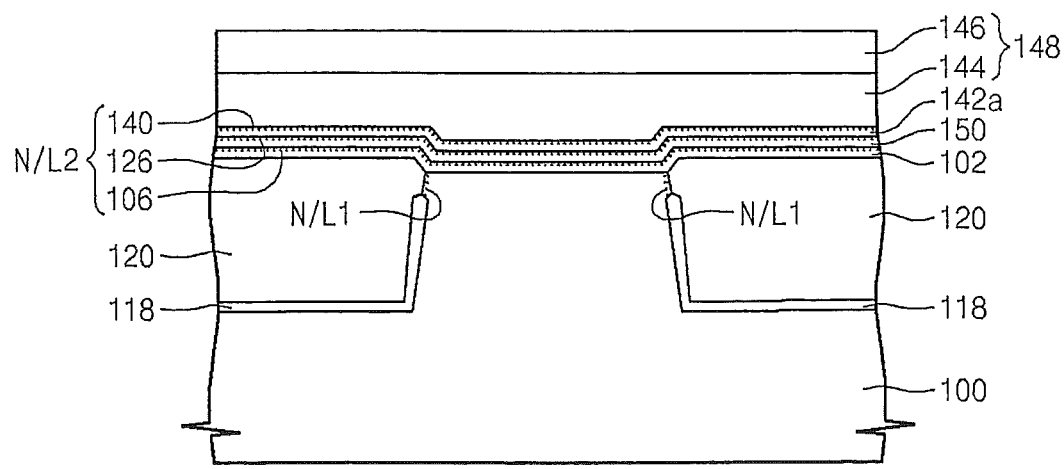
Figure 27B:
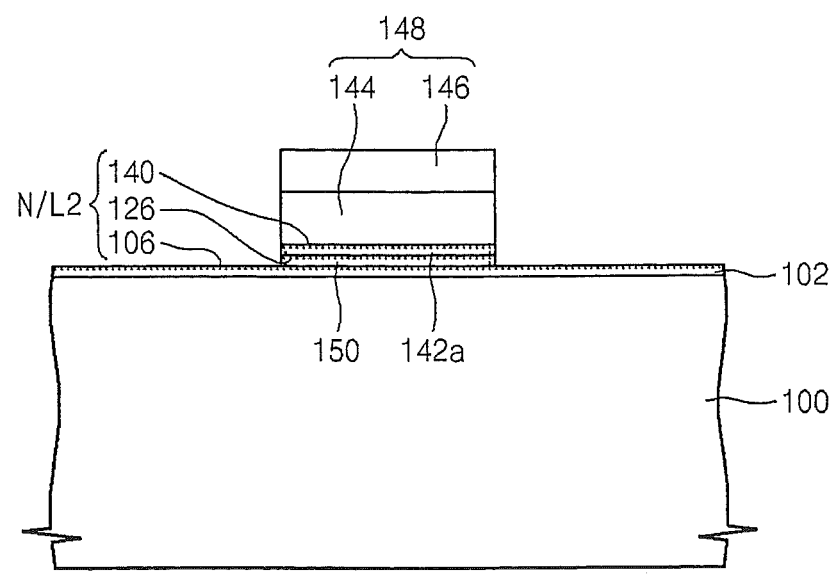
Figure 28A:
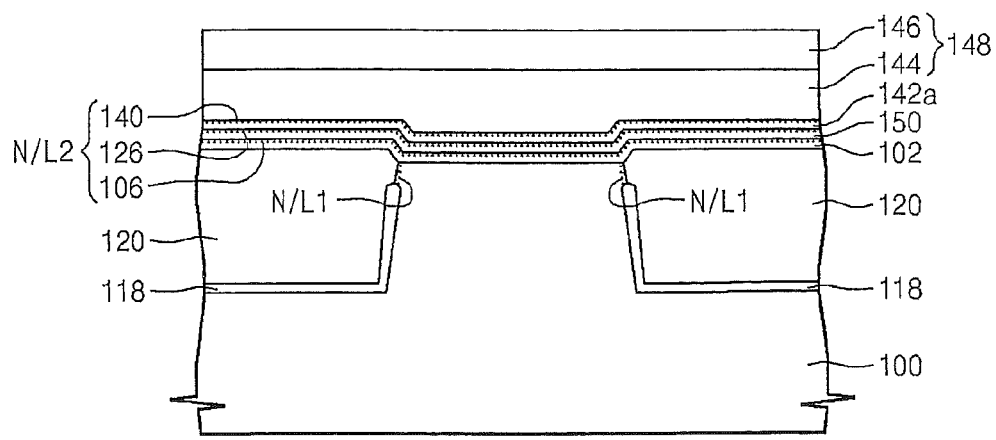
Figure 28B:
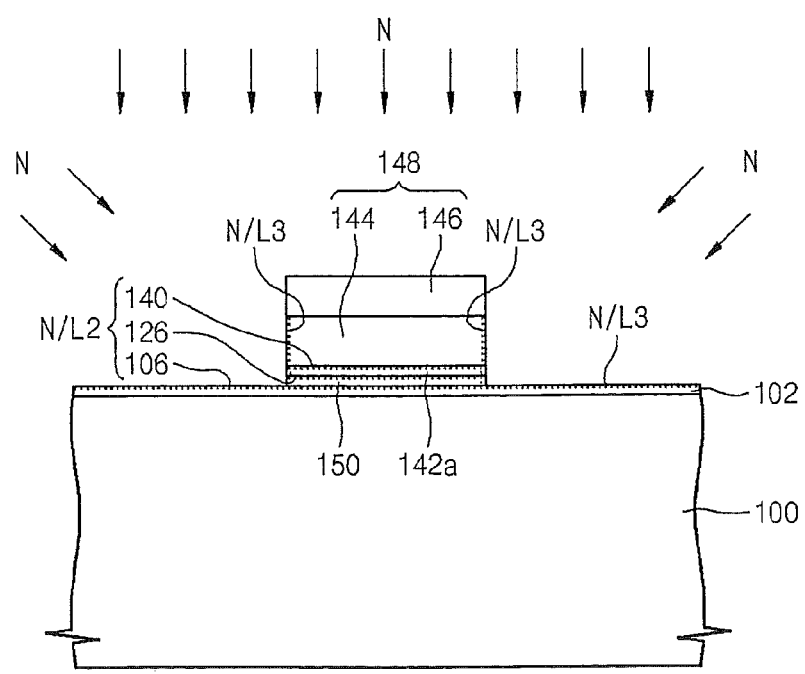
Figure 29A:
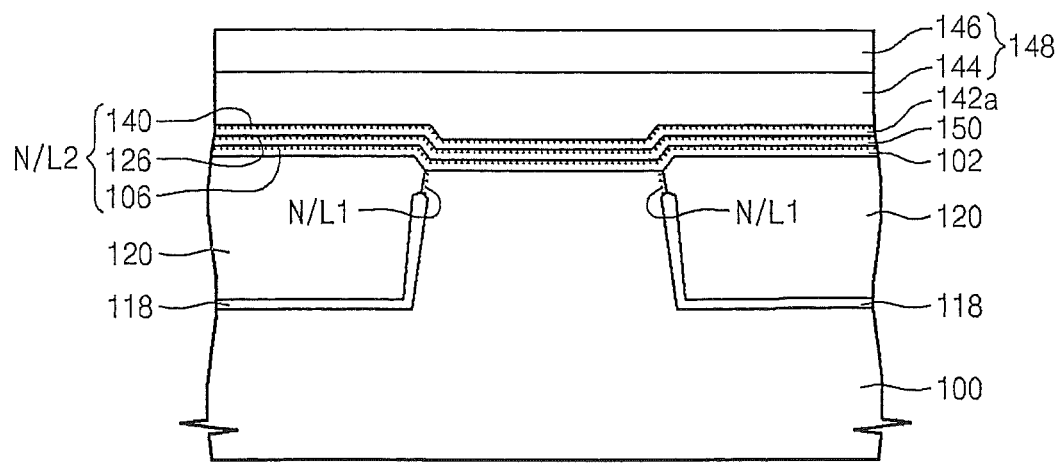
Figure 29B:
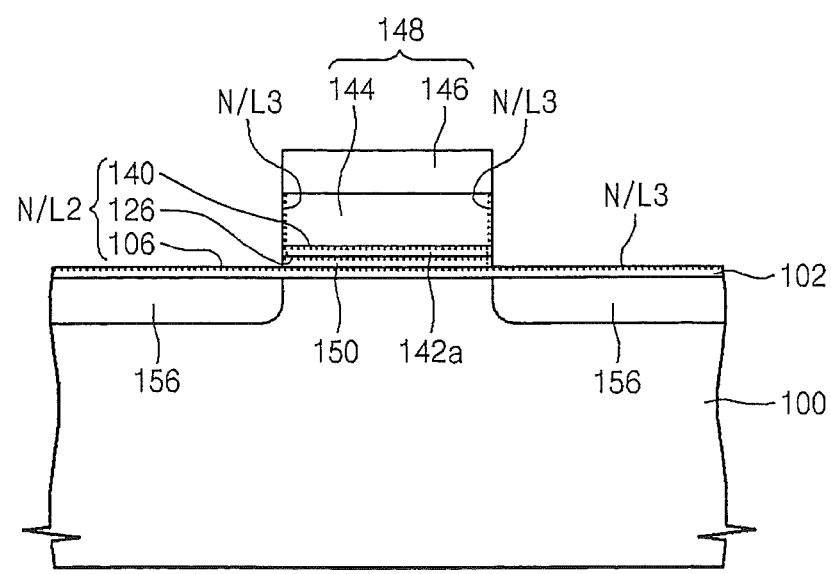

Referring now to FIGS. 27A and 27B, a gate conductive layer is formed on the blocking insulating layer 142. The gate conductive layer, the blocking insulating layer 142 and the charge storage layer 122 are patterned to form a stack gate structure crossing over the device isolation pattern. The stack gate structure includes a charge storage pattern 150, a blocking insulating pattern 142a on the charge storage pattern 150 and a control gate pattern 148 on the blocking insulating pattern 142a, which are aligned to each other. The tunnel insulating layer 102 between the stack gate structures may not be etched during formation of the stack gate structure. The control gate electrode 148 may include polysilicon or a polycide layer that includes a polysilicon layer 144 and a metal silicide layer 146 as illustrated in the Figures.

Referring now to FIGS. 28A through 29B, nitrogen N ions are implanted in sidewalls of the stack gate structure and on the surface of the tunnel insulating layer 102 to form a third nitrogen doped layer N/L3. The third nitrogen doped layer N/L3 may be formed by the plasma nitridation process, the remote plasma nitridation process and/or by annealing the substrate in a gas including nitrogen ambient as discussed above. In some embodiments of the present inventive concept, the tunnel insulating layer 102 may be patterned to remain only under the charge storage pattern 150 during formation of the gate stack structure. In these embodiments of the present inventive concept, the third nitrogen doped layer N/L3 may be formed on sidewalls of the tunnel insulating pattern between the charge storage pattern 150 and the integrated circuit substrate 100. Thus, it may be possible to reduce the likelihood that oxygen atoms will be diffused through the sidewalls of the tunnel insulating pattern. A gate sidewall oxidation process may be performed to cure the etch damage of the sidewalls of the stack gate structure. During gate sidewall oxidation process, the integrated circuit substrate 100 may be annealed. Thus, the amount of oxygen atoms may be diffused into interfaces between the charge storage pattern 150, the blocking insulating pattern 142a and the control gate electrode 148, to form a bird's beak, i.e., thickening of the edges of the blocking insulating pattern 142a and the tunnel insulating pattern. However, the third nitrogen doped layer N/L3 formed on the sidewalls of the stack gate structure may reduce the amount of oxygen atoms diffused into interfaces between the charge storage pattern 150, the blocking insulating pattern 142a and the control gate electrode 148, whereby the bird's beak may be reduced.

Source and drain regions 156 may be formed on the integrated circuit substrate adjacent to the stack gate structure. It will be understood that any subsequent process may be performed using methods known to those having skill in the art.

As discussed above with respect to FIGS. 5 through 29B, nonvolatile memory devices according to some embodiments of the present inventive concept include nitrogen doped layers formed in diffusion routes of oxygen atoms to reduce the likelihood of the formation of a bird's beak, i.e., the thickening of the edge of the tunnel insulating pattern and the blocking insulating pattern. Accordingly, it may be possible to improve endurance and data retention characteristics of the integrated circuit device as well as to reduce a distribution of a threshold voltage in a cell array. A uniform edge of the blocking insulating pattern may provide a lower coupling ratio, enhanced erase speed and enhanced write speed of the nonvolatile memory device.

In the drawings and specification, there have been disclosed typical preferred embodiments of the inventive concept and, although specific terms are employed, they are used in a generic and descriptive sense only and not for purposes of limitation, the scope of the inventive concept being set forth in the following claims.

What is claimed is:

1. A nonvolatile memory device comprising:
    an active region;
    a charge storage pattern on the active region;
    a tunnel insulating layer between the charge storage pattern and the active region;
    a gate pattern on the charge storage pattern; and
    a blocking insulating layer between the charge storage pattern and the gate pattern, the blocking insulating layer having a sidewall,
    wherein the sidewall of the blocking insulating layer includes a first nitrogen doped layer, and wherein the first nitrogen doped layer extends on a sidewall of the gate pattern.

2. The nonvolatile memory device of claim 1, wherein the sidewall of the gate pattern is aligned to the sidewall of the blocking insulating layer.

3. The nonvolatile memory device of claim 1, wherein the tunnel insulating layer extends on the integrated circuit substrate adjacent the charge storage pattern and wherein the first nitrogen doped layer extends on an upper surface of the tunnel insulating layer extended on the integrated circuit substrate adjacent the charge storage pattern.

4. The nonvolatile memory device of claim 1, wherein the blocking insulating layer comprises at least one insulating layer including silicon oxide, silicon nitride, Al2O3, hafnium aluminate, hafnium silicate, HfO2, HfAlO, HfAlON, Hsiao and/or HfSiON and wherein the nonvolatile memory device further comprises:
    a second nitrogen doped layer on an upper surface of one or more of the at least one insulating layer.

5. The nonvolatile memory device of claim 1, wherein the charge storage pattern comprises a dot layer including a conducting material of a dot shape or an insulating material of a dot shape, a charge trap layer, a combination of the dot layer and the charge trap layer or a floating gate pattern and wherein the nonvolatile memory device further comprises:
    a second nitrogen doped layer on an upper surface of at least one of the layers or the floating gate pattern.

6. The nonvolatile memory device of claim 1, further comprising a second nitrogen doped layer on an upper surface of the tunnel insulating layer, the charge storage pattern, and/or the blocking insulating layer.

7. The nonvolatile memory device of claim 1, wherein a majority of an interface between the tunnel insulating layer and the active region is free of nitrogen.

8. The nonvolatile memory device of claim 1, wherein the first nitrogen doped layer extends on a sidewall of the charge storage pattern.

9. The nonvolatile memory device of claim 1, wherein the first nitrogen doped layer extends on a sidewall of the tunnel insulating layer.

\* \* \* \* \*